US008173347B2

(12) United States Patent
Koberstein et al.

(10) Patent No.: US 8,173,347 B2
(45) Date of Patent: May 8, 2012

(54) MICROPATTERNING OF MOLECULAR SURFACES VIA SELECTIVE IRRADIATION

(75) Inventors: Jeffrey T. Koberstein, Storrs, CT (US); Feng Pan, New York, NY (US); Kwangjoo Lee, New York, NY (US); Peng Wang, New York, NY (US)

(73) Assignee: The Trustees of Columbia University in the City of New York, New York, NY (US)

( * ) Notice: Subject to any disclaimer, the term of this patent is extended or adjusted under 35 U.S.C. 154(b) by 1016 days.

(21) Appl. No.: 11/201,915

(22) Filed: Aug. 11, 2005

(65) Prior Publication Data
US 2006/0165912 A1  Jul. 27, 2006

Related U.S. Application Data

(63) Continuation of application No. PCT/US03/04214, filed on Feb. 13, 2003.

(51) Int. Cl.
*G03F 7/00* (2006.01)
(52) U.S. Cl. ............. 430/269; 430/270.1; 430/296; 430/322; 430/324; 430/396
(58) Field of Classification Search ............. 430/270.1, 430/296, 322, 324, 396; 427/405, 419.5, 427/528
See application file for complete search history.

(56) References Cited

U.S. PATENT DOCUMENTS

| | | | |
|---|---|---|---|
| 3,728,408 A | 4/1973 | Tobias | |
| 4,539,061 A | 9/1985 | Sagiv et al. | |
| 5,466,557 A | 11/1995 | Haley et al. | |
| 5,514,501 A | 5/1996 | Tarlov | |
| 5,580,697 A | 12/1996 | Keana et al. | |
| 5,840,467 A | 11/1998 | Kitatani et al. | |
| 5,852,127 A | 12/1998 | Belfort et al. | |
| 5,885,753 A * | 3/1999 | Crooks et al. | 430/325 |
| 6,114,099 A * | 9/2000 | Liu et al. | 430/324 |
| 6,180,288 B1 | 1/2001 | Everhart et al. | |
| 6,200,646 B1 | 3/2001 | Neckers et al. | |
| 6,413,587 B1 | 7/2002 | Hawker et al. | |
| 6,423,465 B1 * | 7/2002 | Hawker et al. | 430/203 |
| 6,492,096 B1 | 12/2002 | Liu et al. | |
| 6,586,158 B2 | 7/2003 | Dobisz et al. | |
| 6,630,404 B1 | 10/2003 | Babcock | |

(Continued)

OTHER PUBLICATIONS

International Search Report issued for International Application No. PCT/US2003/004214.

(Continued)

*Primary Examiner* — Thorl Chea
(74) *Attorney, Agent, or Firm* — Wilmer Cutler Pickering Hale and Dorr LLP

(57) ABSTRACT

A method for surface micropatterning includes forming on a surface containing a first polymer a first coating containing a second polymer having first functionalities capable of being converted to second functionalities by exposure to an acid. A second coating containing a photoacid generator is formed on the first coating. The second coating containing the photoacid generator is selectively irradiated in one or more regions thereof with radiation having a spatially varying internsity pattern to generate an acid in each irradiated region of the second coating. The acid converts the first functionalities of each region of the second polymer underlying a respective irradiated region of the second coating to second functionalities. A first molecular patterned surface having one or more regions of the first functionalities and one or more regions of the second functionalities is formed.

28 Claims, 22 Drawing Sheets

U.S. PATENT DOCUMENTS

| | | | |
|---|---|---|---|
| 6,682,988 B1 | 1/2004 | Babcock | |
| 2002/0107159 A1 | 8/2002 | DeSimone et al. | |
| 2003/0091752 A1 | 5/2003 | Nealey et al. | |
| 2004/0253536 A1* | 12/2004 | Park et al. | 430/270.1 |
| 2006/0165912 A1* | 7/2006 | Koberstein et al. | 427/532 |

OTHER PUBLICATIONS

Abbott, Nicholas L. et al. "Manipulation of the Wettability of Surfaces on the 0.1- to 1-Micrometer Scale Through Micromachining and Molecular Self-Assembly." Science, 257:1380-1382. (Sep. 4, 1992).

Abuchowski, Abraham et al. "Cancer Therapy with Chemically Modified Enzymes. I. Antitumor Properties of Polyethylene Glycol-Asparaginase Conjugates." Cancer Biochem. Biophys., 7:175-186. (1984).

Aizenberg, Joanna et al. "Control of crystal nucleation by patterned self-assembled monolayers." Nature, 398:495-498. (1999).

Aizenberg, Joanna et al. "Patterned Colloidal Deposition Controlled by Electrostatic and Capillary Forces." Physical Review Letters, 84(13):2997-3000. (Mar. 27, 2000).

Akritopoulou-Zanze, Irini et al. "Configuration of Heptopyranoside and Heptofuranoside Side Chains: 2-Anthroate, a Powerful Chromophore for Exciton Coupled CD." Chirality, 9:699-712. (1997).

Anastasiadis, S. H. et al. "Neutron Reflectivity Studies of the Surface-Induced Ordering of Diblock Copolymer Films." Physical Review Letters, 62(16):1852-1855. (Apr. 17, 1989).

Andrade, Joseph D. "X-ray Photoelectron Spectroscopy (XPS)." Surface and Interfacial Aspects of Biomedical Polymers, vol. 1, pp. 105-195. (1985).

Avrameas, Stratis. "Natural Antibodies." Academic Press, pp. 1134-1135. (1991).

Bain, Colin D. et al. "Formation of Monolayer Films by the Spontaneous Assembly of Organic Thiols from Solution onto Gold." J. Am. Chem. Soc., 111:321-335. (1989).

Bain, Collin D. and George M. Whitesides. "Attenuation Lengths of Photoelectrons in Hydrocarbon Films." J. Phys. Chem., 93:1670-1673. (1989).

Bates, Frank S. and Glenn H. Fredrickson. "Block Copolymer Thermodynamics: Theory and Experiment." Annu. Rev. Phys. Chem., 41:525-557. (1990).

Beamson, G. and D. Briggs. High Resolution XPS of Organic Polymers. The Scienta ESCA300 Database, Chichester, England. (1992).

Berek, Claudia and Cesar Milstein. "The Dynamic Nature of the Antibody Repertoire". Immunological Reviews, No. 105, pp. 5-26. (1988).

Bernard, Andre et al. "Printing Patterns of Proteins." Langmuir, 14(9):2225-2229. (Apr. 28, 1998).

Bhatia, Qamardeep S. et al. "Preferential Surface Adsorption in Miscible Blends of Polystyrene and Poly (vinyl methyl ether)." Macromolecules, 21:2166-2175. (1988).

Blawas, A. S. and W. M. Reichert. "Review: Protein Patterning." Biomaterials, 19:595-609. (1998).

Bourg, Marie-Caroline et al. "Gold-Sulfur Bonding in 2D and 3D Self-Assembled Monolayers: XPS Characterization." J. Phys. Chem., 104:6562-6567. (2000).

Bow, Sing-Tze. Pattern Recognition and Image Preprocessing, Marcel Dekker, Inc., New York. (1992).

Brandrup, J. et al. Polymer Handbook, John Wiley & Sons, Inc., New York. (1999).

Briggs, David and Graham Beamson. "XPS Studies of the Oxygen 1s and 2s Levels in a Wide Range of Functional Polymers." Anal. Chem., 65:1517-1523. (1993).

Brown, Glenn H. Techniques of Chemistry, vol. III, Photochromism, Wiley-Interscience, New York. (1971).

Brown, Gregory et al. "Layering Phase Separation of Densely Grafted Diblock Copolymers." Macromolecules, 28:7817-7821. (1995).

Brown, Michael P. S. et al. "Knowledge-based analysis of microarray gene expression data by using support vector machines." PNAS, 97(1):262-267. (Jan. 4, 2000).

Burges, Christopher J. C. "A Tutorial on Support Vector Machines for Pattern Recognition." Data Mining and Knowledge Discovery, 2:121-167. (1998).

Burmeister, Frank et al. "Colloid Monolayers as Versatile Lithographic Masks." Langmuir, 13:2983-2987. (1997).

Cameron, James F. et al. "Photogeneration of Amines from α-Keto Carbamates: Photochemical Studies." J. Am. Chem. Soc., 118:12925-12937. (1996).

Castner, David G. et al. "X-ray Photoelectron Spectroscopy Sulfur 2p Study of Organic Thiol and Disulfide Binding Interactions with Gold Surfaces." Langmuir, 12:5083-5086. (1996).

Clackson, Tim et al. "Making antibody fragments using phage display libraries." Nature, 352:624-628. (Aug. 15, 1991).

Coessens, Veerle et al. "Functionalization of polymers prepared by ATRP using radical addition reactions." Macromol. Rapid Commun., 21:103-109. (2000).

Corrie, John E. T. and David R. Trentham. "Caged Nucleotides and Neurotransmitters." Bioorganic Photochemistry, 2:243-305. (1993).

Coulon, G. et al. "Surface-Induced Orientation of Symmetric, Diblock Copolymers: A Secondary Ion Mass Spectrometry Study." Macromolecules, 22:2581-2589. (1989).

Dannenberger, O. et al. "An orientation analysis of differently endgroup-funtionalised alkanethiols adsorbed on Au substrates." Thin Sold Films, 307:183-191. (1997).

Day, William H. E. and Herbert Edelsbrunner. "Efficient Algorithms for Agglomerative Hierarchical Clustering Methods." Journal of Classification 1:7-24. (1984).

Delamarche, E. et al. "Immobiliation of Antibodies on a Photoactive Self-Assembled Monolayer on Gold." Langmuir, 12:1997-2006. (1996).

Deng, Chao et al. "Normalization of cDNA Microarray Data by using Neural Networks." Proceedings of the 2002 International Joint Conference on Neural Networks. May 12-17, 2002.

DeSimone, J. M. et al. "Dispersion Polymerizations in Supercritical Carbon Dioxide." Science, 265:356-359. (Jul. 15, 1994).

Dewez, J. L. et al. "Adhesion of mammalian cells to polymer surfaces: from physical chemistry of surfaces to selective adhesion on definied patterns." Biomaterials, 19:1441-1445. (1998).

Deye, Jerry F. et al. "Nile Red as a Solvatochromic Dye for Measuring Solvent Strength in Normal Liquids and Mixtures of Normal Liquids with Supercritical and Near Critical Fluids." Anal. Chem., 62:615-622. (1990).

Dhirani, Al-Amin et al. "Self-Assembly of Conjugated Molecular Rods: A High-Resolution STM Study." J. Am. Chem. Soc., 118:3319-3320. (1996).

Dorman, Gyorgy and Glenn D. Prestwich. "Using photolabile ligands in drug discovery and development." Tibtech, 18:64-77. (Feb. 2000).

Dorman, Gyorgy and Glenn D. Prestwick. "Benzophenone Photophores in Biochemistry." Biochemistry, 33(19):5661-5673. (May 17, 1994).

Douvas, Antonios et al. "Biocompatible photolithographic process for the patterning of biomolecules." Biosensors & Bioelectronics, 17:269-278. (2002).

Duda, Richard O. et al. Pattern Classification. John Wiley & Sons, Inc., New York. (2001).

Dulcey, Charles S. et al. "Photochemistry and Patterning of Self-Assembled Monolayer Films Containing Aromatic Hydrocarbon Functional Groups." Langmuir, 12:1638-1650. (1996).

Eynde, X. Vanden and P. Bertrand. "Combined XPS and ToF-Sims Study of Miscible Polymer Blend Surfaces: Polystyrene/Poly(2,6-dimethyl-1,4-phenylene oxide) (PS/PDMPO)." Surface and Interface Analysis, 27:157-164. (1999).

Ezzell, John W. et al. "Identification of *Bacillus anthracis* by Using Monoclonal Antibody to Cell Wall Galactose-N-Acetylglucosamine Polysaccharide." Journal of Clinical Microbiology, 28(2):223-231. (Feb. 1990).

Fadley, Charles S. "Solid State-and Surface-Analysis by Means of Angular-Dependent X-Ray Photoelectron Spectroscopy." Progress in Solid State Chemistry, 11:265-343. (1976).

Flounders, A. W. et al. "Patterning of immobilized antibody layers via photolithography and oxygen plasma exposure." Biosensors & Bioelectronics, 12(6):447-456. (1997).

Fodor, Stephen P. A. et al. "Light-Directed, Spatially Addressable Parallel Chemical Synthesis." Science, 251:767-773. (Feb. 15, 1991).

Forster, T. "Delocalized Excitation and Excitation Transfer." Section III. B Light and Organic Crystals, Academic Press, London, pp. 93-137. (1965).

Frechet, Jean M. J. et al. "Photogenerated Base in Resist and Imaging Materials: Design of Functional Polymers Susceptible to Base Catalyzed Decarboxylation." Chem. Mater., 9:2887-2893. (1997).

Frey, S. et al. "Structure of Thioaromatic Self-Assembled Monolayers on Gold and Silver." Langmuir, 17:2408-2415. (2001).

Fried, Roland et al. "Online Pattern Recognition in Intensive Care Medicine." AMIA, pp. 184-188. (2001).

Furey, Terrence S. et al. "Support vector machine classification and validation of cancer tissue samples using microarray expression data." Bioinformatics, 16(10):906-914. (2000).

Gabor, Allen H. et al. "Lithographic Properties of Poly(tert-butyle methacrylate)-Based Block and Random Coopolymer Resists Designed for 193 nm Wavelength Exposure Tools." Chem. Mater., 8:2282-2290. (1996).

Geyer, W. et al. "Electron-induced crosslinking of aromatic self-assembled monolayers: Negative resists for nanolothography." Applied Physics Letters, 75(16):2401-2403. (2001).

Gillen, Greg et al. "Molecular Imaging Secondary Ion Mass Spectrometry for the Characterization of Patterned Self-Assembled Monolayers on Silver and Gold." Anal. Chem., 66:2170-2174. (1994).

Gillen, Greg et al. "Patterning of self-assembled alkanethiol monolayers on silver by microfocus ion and electron beam bombardment." Appl. Phys. Lett., 65(5):534-536. (Aug. 1, 1994).

Gillmor, S. D. et al. "Hydrophilic/Hydrophobic Patterned Surfaces as Templates for DNA Arrays." Langmuir, 16:7223-7228. (2000).

Guiomar, A. Jorge et al. "Use of Mixed Self-Assembled Monolayers in a Study of the Effect of the Microenvironment on Immobilized Glucose Oxidase." Langmuir, 15:1198-1207. (1999).

Han, Sang Woo et al. "Azobenzene-Incorporated Alkanethiol Monolayer Film on Au(111): Reflection-Absorption Infrared Spectroscopy and Atomic Force Microscopy Study." Langmuir, 15:1579-1583. (1999).

Harrison, Kristi L. et al. "Effect of Surfactants on the Interfacial Tension between Supercritical Carbon Dioxide and Polyethylene Glycol." Langmuir, 12:2637-2644. (1996).

Hata, K. et al. "Selective adsorption and patterning of Si nanoparticles fabricated by laser ablation on functionalized self-assembled monolayer." Applied Physics Letters, 79(5):692-694. (Jul. 30, 2001).

Hayashi, Sadao et al. "Imaging by Polystyrene Latex Particles." Journal of Colloid and Interface Science, 144(2):538-547. (Jul. 2, 1991).

Hengsakul, Manchumas and Anthony E. G. Cass. "Protein Patterning with a Photoactivatable Derivative of Biotin." Bioconjugate Chem., 7:249-254. (1996).

Henkee, Chris S. et al. "The effect of surface constraints on the ordering of block copolymer domains." Journal of Materials Science, 23:1685-1694. (1988).

Hem, Diane L. and Jeffrey A. Hubbell. "Incorporation of adhesion peptides into nonadhesive hydrogels useful for tissue resurfacing." J. Biomed. Mater. Res, 39:266-276. (1998).

Heyer, Laurie et al. DIMACS Workshop on Analysis of Gene Expression Data. Oct. 24-26, 2001. Rutgers University, Piscataway, NJ.

Himmelhaus, M. and H. Takei. "Self-assembly of polystyrene nano particles into patterns of random-close-packed monolayers via chemically induced adsorption." Phys. Chem. Chem. Phys., 4:496-506. (2002).

Holden, D. A. et al. "Studies of Singlet Energy Transfer in Polymers by Time-Resolved Fluorescence Spectroscopy." Annals New York Academy of Science, 366:11-23. (1981).

Holmes-Farley, Stephen Randall et al. "Acid-Base Behavior of Carboxylic Acid Groups Covalently Attached at the Surface of Polyethylene: The Usefullness of Contact Angle in Following the Ionization of Surface Functionality." Langmuir, 1:725-740. (1985).

Hu, S. et al., "Photochemical Reactions of Alkyl Phenylglyoxylates," J. Org. Chem. 1996, 61, 6407-6415.

Huang, Jingyu and John C. Hemminger. "Photooxidation of Thiols in Self-Assembled Monolayers on Gold." J. Am. Chem. Soc., 115:3342-3343. (1993).

Huang, Jingyu et al. "Photopatterning of Self-Assembled Alkanethiolate Monolayers on Gold: A Simple Monolayer Photoresist Utilizing Adueous Chemistry." Langmuir, 10:626-628. (1994).

Huang, Shao-Chie et al. "Site-Specific Immobilization of Monoclonal Antibodies Using Spacer-Mediated Antibody Attachment." Langmuir, 12:4292-4298. (1996).

Husemann, Marc et al. "Manipulation of Surface Properties by Patterning of Covalently Bound Polymer Brushes." J. Am. Chem. Soc., 122:1844-1845. (2000).

Husemann, Marc et al. "Surface-Initiated Polymerization for Amplification of Self-Assembled Monolayers Patterned by microcontact Printing." Angew. Chem. Int. Ed., 38(5):647-649. (1999).

Hyun, Jinho and Ashutosh Chilkoti. "Micropatterning Biological Molecules on a Polymer Surface Using Elastomeric Microwells." J. Am. Chem. Soc., 123:6943-6944. (2001).

Hyun, Jinho et al. "Micropatterns of a Cell-Adhesive Peptide on an Amphiphilic Comb Polymer Film." Langmuir, 18:2975-2979. (2002).

Hyun, Jinho et al. "Microstamping on an Activated Polymer Surface: Patterning Biotin and Streptavidin onto Common Polymeric Biomaterials." Langmuir, 17:6358-6367. (2001).

Infelta, P. P. et al. "Luminescence Decay of Hydrophobic Molecules Solubilized in Aqueous Micellar Systems. A Kinetic Model." The Journal of Physical Chemistry, 79(2):190-195. (1974).

Ishida, Takao and Nami Choi. "High-Resolution X-ray Photoelectron Spectra of Organosulfur Monolayers on Au(111): S(2p) Spectral Dependence on Molecular Species." Langmuir, 15:6799-6806. (1999).

Jain, Anil K. et al. "Statistical Pattern Recognition: A Review." IEEE Transactions on Pattern Analysis and Machine Intelligence, 22(1):4-37. (Jan. 2000).

Jain, L. C. et al. Intelligent Biometric Techniques in Fingerprint and Face Recognition. CRC Press, Boca Raton, FL. (1999).

Jolliffe, I. T. Principal Component Analysis, Springer-Verlag, New York. (1986).

Jonas, Ulrich et al. "Colloidal assemblies on patterned silane layers." PNAS, 99(8):5034-5039. (Apr. 16, 2002).

Ju, Jingyue et al. "Cassette labeling for facile construction of energy transfer fluorescent primers." Nucleic Acids Research, 24(6):1144-1148. (1996).

Ju, Jingyue et al. "Energy transfer primers: A new fluorescence labeling paradigm for DNA sequencing and analysis." Nature Medicine, 2(2): 246-249. (Feb. 1996).

Ju, Jingyue et al. "Fluorescence energy transfer dye-labeled primers for DNA sequencing and analysis." Proc. Natl. Acad. Sci., 92:4347-4351. (May 1995).

Karim, A. et al. "Phase separation of ultrathin polymer-blend films on patterned substrates." 57(6):R6273-R6276. (Jun. 1998).

Kaski, Samuel. "Dimensionality Reduction by Random Mapping: Fast Similarity Computation for Clustering." IEEE, pp. 413-418. (1998).

Kim, Chi S. et al. "Preparation of anthracene-labelled poly(methyl methacrylate) via atom transfer radical polymerization." Macromol. Rapid Comun., 19:191-196. (1998).

Kim, Seungchan et al. "General nonlinear framework for the analysis of gene interaction via multivariate expression arrays." Journal of Biomedical Optics, 5 4):411-424. (Oct. 2000).

Kim, Sunwook and K. P. Johnston. "Effects of Supercritical Solvents on the Rates of Homogeneous Chemical Reactions." Supercritical Fluids Chemical Engineering Principles and Applications, American Chemical Society, Symposium Series, Washington, DC, 329:42-55. (1987).

Koberstein, J. T. "Polymer Surfaces and Interfaces." MRS Bulletin, pp. 16-18. (Jan. 1996).

Koberstein, J. T. et al. "Creating Smart Polymer Surfaces with Selective Adhesion Properties." J. Adhesion, 66:229-249. (1998).

Kohler, G. and C. Milstein. "Continuous cultures of fused cells secreting antibody of predefined specificity." Nature, 256:495-497. (Aug. 7, 1975).

Kokkoli, Efrosini et al. "Surface Pattern Recognition by a Colloidal Particle." Langmuir, 17:369-376. (2001).

Kondo, Toshihiro et al. "Determination of Thickness of a Self-Assembled Monolayers of Dodecanethiol on Au(111) by Angle-Resolved X-ray Photoelectron Spectroscopy." Langmuir, 14:5656-5658. (1998).

Kumar, Amit and George M. Whitesides. "Features of gold having micrometer to centimeter dimensions can be formed through a combination of stamping with an elastomeric stamp and an alkanethiol 'ink' followed by chemical etching." Appl. Phys. Lett., 63(14):2002-2004. (Oct. 1993).

Kumar, Amit and George M. Whitesides. "Patterned Condensation Figures as Optical Diffraction Gratings." Science, 263:60-62. (Jan. 7, 1994).

Kumar, Amit et al. "Patterned Self-Assembled Monolayers and Meso-Scale Phenomena." Acc. Chem. Res., 28:219-226. (1995).

Kumar, Amit et al. "Patterning Self-Assembled Monolayers: Applications in Materials Science." Langmuir, 10:1498-1511. (1994).

Laibinis, Paul E. et al. "Attenuation of Photoelectrons in Monolayers of n-Alkanethiols Adsorbed on Copper, Silver and Gold." J. Phys. Chem., 95:7017-7021. (1991).

Lee, Milton L. and Karin E. Markides. Analytical Supercritical Fluid Chromatography and Extraction. Chromatography Conferences, Inc., Provo, Utah. (1990).

Lepilleur, Carole and Eric J. Beckman. "Dispersion Polymerization of Methyl Methacrylate in Supercritical $CO_2$." Macromolecules, 30:745-756. (1997).

Li, Jintong et al. "Dynamics of Pressure-Induced Phase Separation in Polymer Solutions. The Dependence of the Demixing Pressures on the Rate of Pressure Quench in Solutions of Poly(dimethylsiloxane) in Supercritical Carbon Dioxide." Ind. Eng. Chem. Res., 38:4486-4490. (1999).

Li, Xinsong et al. "An observation on excimer formation in pyrenyl-labelled polystyrene: concentrated solution and solvent-plasticized film." Polymer International, 48:630-632. (1999).

Lopez, Gabriel P. et al. "Imaging of Features on Surfaces by Condensation Figures." Science, 260:647-649. (Apr. 30, 1993).

Luo, Laibin and Adi Eisenberg. "Thermodynamic Stabilization Mechanism of Block Copolymer Vesicles." J. Am. Chem. Soc., 123:1012-1013. (2001).

MacBeath, Gavin and Stuart L. Schreiber. "Printing Proteins as Microarrays for High-Throughput Function Determination." Science, 289:1760-1763. (Sep. 8, 2000).

MacDonald, Scott A. et al. "Chemical Amplification in High-Resolution Imaging Systems." Accounts of Chemical Research, 27(6):151-158. (Jun. 1994).

Mansky, P. et al. "Ordered Diblock Copolymer Films on Random Copolymer Brushes." Macromolecules, 30:6810-6813. (1997).

Marks, James D. et al. "By-passing Immunization Human Antibodies from V-gene Libraries Displayed on Phage." J. Mol. Biol., 222:581-597. (1991).

McGhee, Jerry R. "Regulation of IgA Synthesis and Immune Response by T Cells and Interleukins." Journal of Clinical Immunology, 9(3):175-199. (1989).

McHugh, M. A. et al. "Cosolvent effect alkyl acrylates on the phase behaviour of poly(alkyl acrylates)—supercritical $CO_2$ mixtures." Polymer, 39(24):6049-6052. (1998).

McHugh, Mark A. And Val J. Kurkonis. Supercritical Fluid Extraction. Butterworth Publishers, Stoneham, MA. (1986).

Mooney, J. F. et al. "Patterning of functional antibodies and other proteins by photolithography of silane monolayers." Proc. Natl. Acad. Sci., 93:12287-12291. (Oct. 1996).

Morawetz, Herbert. "Fluorescence Studies of Ionomers." Acc. Chem. Res., 27:174-178. (1994).

Nadler, Morton and Eric P. Smith. Pattern Recognition Engineering, John Wiley & sons Inc., New York. (1993).

Nakagawa, Masaru et al. "Photopatterning and Visualization of Adsorbed Monolayers of Bis(1-benzyl-4-pyrdinio)ethylene Moieties." Adv. Mater., 12(6):403-407. (2000).

Neff, J. A. et al. "A novel method for surface modification to promote cell attachment to hydrophobic substrates." J. Biomed. Mater. Res., 40:511-519. (1998).

Nelson, Kjell E. et al. "Surface Characterization of Mixed Self-Assembled Monolayers Designed for Streptavidin Immobilization." Langmuir, 17:2807-2816. (2001).

Ni, Shaoru et al. "Energy Transfer Studies of the Boundary Layer Interphase in Polystyrene-Poly(methyl methacrylate) Block Copolymer Films." Macromolecules, 27:5742-5750. (1994).

Nicolau, Dan V. et al. "Actin Motion on Microlithographically Functionalized Myosin Surfaces and Tracks." Biophysical Journal, 77:1126-1134. (Aug. 1999).

Nicolau, Dan V. et al. "Micron-Sized Protein Patterning on Diazonaphthoquinone/Novolak Think Polymeric Films." Langmuir, 14:1927-1936. (1998).

Nicolau, Dan V. et al. "Protein patterning via radiation-assisted surface functionalization of conventional microlithographic materials." Colloids and Surfaces A: 155:51-62. (1999).

Nilsson, Kurt and Klaus Mosbach. "Immobilization of Enzymes and Affinity Ligands to Various Hydroxyl Group Carrying Supports using Highly reactive Sulfonyl Chlorides." Biochemical and Biophysical Research Communications, 102(1):449-457. (Sep. 16, 1981).

O'Neill, M. L. et al. "Emulsion Stabilization and Flocculation in CO2. 1. Turbidimetry and Tensiometry." Macromolecules, 30:5050-5059. (1997).

O'Neill, M. L. et al. "Solubility of Homopolymers and Copolymers in Carbon Dioxide." Ind. Eng. Chem. Res., 37:3067-3079. (1998).

Palacin, Serge et al. "Patterning with Magnetic Materials at the Micron Scale." Chem. Mater., 8:1316-1325. (1996).

Pappas, S. Peter. "Photogeneration of Acid: Part 6—A Review of Basic principles for Resist Imaging Applications." Journal of Imaging Technology, 11:146-157. (1985).

Peppas, Nicholas A. and Robert Langer. "New Challenges in Biomaterials." Science, 263:1715-1720. (Mar. 25, 1994).

Peters, Richard D. et al. "Using Self-Assembled Monolayers Exposed to X-rays to Control the Wetting Behavior of Thin Films of Diblock Copolymers." Langmuir, 16:4625-4631. (2000).

Petosa, Carlo et al. "Crystal structure of the anthrax toxin protective antigen." Nature, 385:833-838. (Feb. 27, 1997).

Phaneuf, Matthew D. et al. "Covalent linkage of recombinant hirudin to poly(ethylene terephthalate) (Dacron): creation of a novel antithrombin surface." Biomaterials, 18:755-765. (1997).

Pillai, V. N. Rajasekharan. "Photolytic Deprotection and Activation of Functional Groups." Organic Photochemistry, pp. 225-323. (1987).

Popat, Kris and Kenneth Zeger. "Robust quantization of Memoryless Sources Using Dispersive FIR Filters." IEEE Transactions on Communications, 40(11):1670-1674. (Nov. 1992).

Prestwich, Glenn D. et al. "Benzophenone Photoprobes for Phosphoinositides, Peptides and Drugs." Photochemistry and Photobiology, 65(2):222-234. (1997).

Qin, Dong et al. "Fabrication of Ordered Two-Dimensional Arrays of Micro- and Nanoparticles Using Patterned Self-Assembled Monolayers as Templates." Adv. Mater., 11(17):1433-1437. (1999).

Ramaswamy, Sridhar et al. "Multiclass cancer diagnosis using tumor gene expression signatures." PNAS, 98(26):15149-15154. (Dec. 18, 2001).

Ramdas, Latha et al. "Sources of nonlinearity in cDNA microarray expression measurements." Genome Biology, 2(11):47.1-47.7. (Oct. 18, 2001).

Rasmussen, James R. et al. "Introduction, Modification, and Characterization of Functional Groups on the Surface of Low-Density Polyethylene Film." Journal of the American Chemical Society, 99(14):4736-4745. (Jul. 6, 1977).

Reichmanis, Elsa et al. "Copolymer Approach to Design of Sensitive Deep-UV Resist Systems with High Thermal Stability and Dry Etch Resistance." Polymers in Microlithography Materials and Processes, American Chemical Society, Washington, DC. (1989).

Revzin, Alexander et al. "Fabrication of Poly(ethylene glycol) Hydrogel Microstructures Using Photolithography." Langmuir, 17:5440-5447. (2001).

Rice, Jeanette K. et al. "State-Dependent Solvation of Pyrene in Supercritical $CO_2$." J. Am. Chem. Soc., 117:5832-5839. (1995).

Rindfleisch, Frank et al. "Solubility of Polymers and Copolymers in Supercritical $CO_2$." J. Phys. Chem., 100:15581-15587. (1996).

Robb, R.A., "Biomedical Imaging, Visualization, and Analysis," entire book, 2000.

Rosenblum, B. B. et al. "New dye-labeled terminators for improved DNA sequencing patterns." Nucleic Acids Research, 25(22):4500-4504. (1997).

Ross, Claudia B. et al. "Scanning Probe Lithography. 1. Scanning Tunneling Microscope Induced Lithography of Self-Assembled n-Alkanethiol Monolayer Resists." Langmuir, 9:632-636. (1993).

Roxlo, C. B. et al. "Edge Surfaces in Lithographically Textured Molybdenum Disulfide." Science Reports, 235:1629-1631. (Mar. 27, 1987).

Sabatani, Eyal et al. "Thioaromatic Monolayers on Gold: A New Family of Self-Assembling Monolayers." Langmuir, 9:2974-2981. (1993).

Sabongi, Gebran J. Chemical Triggering. Reactions of Potential Utility in Industrial Processes. Plenum Press, New York. (1987).

Saxon, Eliana and Carolyn r. Bertozzi. "Cell Surface Engineering by a Modified Staudinger Reaction." Science, 287:2007-2010. (Mar. 17, 2000).

Schwarz, Alexandra et al. "Micropatterning of Biomolecules on Polymer Substrates." Langmuir, 14:5526-5531. (1998).

Seok, Chaok et al. "Polymer blends near patterned surfaces." Journal of Chemical Physics, 112(14):6452-6460. (Apr. 8, 2000).

Shin, Yongsoon et al. "Supercritical processing of functionalized size selective microporous materials." Microporous and Mesoporous Materials, 37:49-56. (2000).

Siewierski, L. M. et al. "Photoresponsive Monolayers Containing In-Chain Azobenzene." Langmuir, 12:5838-5844. (1996).

Singhvi, Rahul et al. "Engineering Cell Shape and Function." Science, 264:695-698. (Apr. 29, 1994).

Smith, Roger M. Supercritical Fluid Chromatography, Royal Society of Chemistry, London. (1988).

Snapper, Clifford M. Cytokine Regulation of Humoral Immunity Basic and Clinical Aspects, John Wiley & Sons, Chichester, England. (1996).

Stryer, Lubert. "Fluorescence Energy Transfer as a Spectroscopic Ruler." Ann. Rev. Biochem., 47:819-846. (1978).

Su, Andrew I. et al. "Molecular Classification of Human Carcinomas by Use of Gene Expression Signatures." Cancer Research, 61:7388-7393. (Oct. 15, 2001).

Sun, Yukie and Gilbert C. Walker. "Two-Dimensional Self-Assembly of Latex Particles in Wetting Films on Patterned Polymer Surfaces." J. Phys. Chem. B, 106:2217-2223. (2002).

Sundberg, Steven A. et al. "Spatially-Addressable Immobilization of Macromolecules on Solid Supports." J. Am. Chem. Soc., 117:12050-12057. (1995).

Tachiya, Masaanori. "Application of a Generating Function to Reaction Kinetics in Micelles. Kinetics of quenching of Luminescent Probes in Micelles." Chemical Physics Letters, 33(2):289-292. (Jun. 1, 1975).

Tamada, K. et al. "Molecular Packing of Semifluorinated Alkanethiol Self-Assembled Monolayers on Gold: Influence of Alkyl Spacer Length." Langmuir, 17:1913-1921. (2001).

Tan, John L. et al. "Microcontact Printing of Proteins on Mixed Self-Assembled Monolayers." Langmuir, 18:519-523. (2002).

Tao, Yu-Tai et al. "Structure Evolution of Aromatic-Derivatized Thiol Monolayers on Evaporated Gold." Langmuir, 13:4018-4023. (1997).

Tarlov, Michael J. et al. "UV Photopatterning of Alkanethiolate Monolayers Self-Assembled on Gold and Silver." J. Am. Chem. Soc., 115:5305-5306. (1993).

Taylor, Larry. Supercritical Fluid Extraction. John Wiley & Sons, Inc. New York. (1996).

Tiberio, R. C. et al. "Self-assembled monolayer electron beam resist on GaAs." Appl. Phys. Lett., 62(5):476-478. (1993).

Tong, Anthony K. and Jingyue Ju. "Single nucleotide polymorphism detection by combinatorial fluorescence energy transfer tags and biotinylated dideoxynucleotides." Nucleic Acids Research, 30(5):1-7. (2002).

Tong, Anthony K. et al. "Combinatorial fluorescence energy transfer tags for multiplex biological assays." Nature Biotechnology, 19:756-759. (Aug. 2001).

Tong, Anthony K. et al. "Triple Fluorescence Energy Transfer in Covalently Trichromophore-Labeled DNA." J. Am. Chem. Soc., 123:12923-12924. (2001).

Tong, Jiang-Dong et al. "Synthesis of Meth(acrylate) Diblock Copolymers Bearing a Fluorescent Dye at the Junction Using a Hydroxyl-Protected Initiator and the Combination of Anionic Polymerization and Controlled Radical Polymerization." Macromolecules, 34:696-705. (2001).

Torkelson, John M. et al. "Polystyrene-Methylcyclohexane Solutions Undergoing Phase Separation: A Study by Bluorescence Spectroscopy." Macromolecules, 17:1505-1512. (1984).

Tour, James M. et al. "Self-Assembled Monolayers and Multilayers of Conjugated Thiols,$\alpha,\omega$-Dithiols, and Thioacetyl-Containing Adsorbates. Understanding Attachments between Potential Molecular Wires and Gold Surfaces." J. Am. Chem. Soc., 117:9529-9534. (1995).

Tsao, Mei-Wei et al. "Formation and Characterization of Self-Assembled Films of Thiol-Derivatized Poly(Dimethylsiloxane) on Gold." Macromolecules, 30:5913-5919. (1997).

Tseng, George C. et al. "Issues in cDNA microarray analysis: quality filtering, channel normalization, models of variations and assessment of gene effects." Nucleic Acids Research, 29(12):2549-2557. (2001).

Ulman, Abraham and James F. Elman. "X-Ray Photoelectron Spectroscopy of Organic Thin Films." Chapter 11, pp. 213-225. (1995).

Vacheethasanee, Katanchalee and Roger E. Marchant. "Surfactant polymers designed to suppress bacterial (*Staphylococcus epidermidis*) adhesion on biomaterials." J. Biomed. Mater. Res., 50:302-312. (2000).

van Blaaderen, Alfons and Pierre Wiltzius. "Growing Large, Well-Oriented Colloidal Crystals." Adv. Mater., 9(10):833-835. (1997).

van Blaaderen, Alfons et al. "Template-directed colloidal crystallization." Nature, 385:321-324. (Jan. 1997).

Vapnik, Vladimir N. "An Overview of Statistical Learning Theory." IEEE Transactions on Neural Networks, 10(5):988-999. (Sep. 1999).

Vapnik, Vladimir N. Statistical Learning Theory, John Wiley & Sons, Inc., New York. (1998).

Vapnik, Vladimir N. The Nature of Statistical Learning Theory. Springer-Verlag, New York. (1995).

Vavasour, J. D. and M. D. Whitmore. "Self-Consistent Mean Field Theory of the Microphases of Diblock Copolymers." Macromolecules, 25:5477-5486. (1992).

Wallraff, G. M. and W. D. Hinsberg. "Lithographic Imaging Techniques for the Formation of Nanoscopic Features." Chem. Rev., 99:1801-1821. (1999).

Wang, Denong and Elvin A. Kabat. "Antibodies, Specificity." Academic Press, London, pp. 148-154. (1998).

Wang, Denong and Elvin A. Kabat. "Carbohydrate Antigens (Polysaccharides)." Structure of Antigens, 3:247-277. (1996).

Wang, Denong et al. "Carbohydrate microarrays for the reconition of cross-reactive molecular markers of microbes and host cells." Nature Biotechnology, 20:275-281. (Mar. 2002).

Wang, Denong et al. "The Repertoire of Antibodies to a Single Antigenic Determinant." Molecular Immunology, 28(12):1387-1397. (1991).

Wang, Denong et al. "Two Families of Monoclonal Antibodies to $\alpha(1-6)$Dextran, VH19.1.2 and VH9.14.7, Show Distinct Patterns of Jx and JH Minigene Usage and Amino Acid Substitutions in CDRD1." The Journal of Immunology, 145(9):3002-3010. (1990).

Wang, Jason T. L. et al. Pattern Discovery in Biomolecular Data, Oxford University Press, New York. (1999).

Watkins, James J. et al. "Chemical Fluid Deposition: Reactive Deposition of Platinum Metal from Carbon Dioxide Solution." Chem. Mater., 11:213-215. (1999).

Werwa, E. et al. "Synthesis and processing of silicon nanocrystallites using a pulsed laser ablation supersonic expansion method." Appl. Phys. Lett., 64(14):1821-1823. (Apr. 1994).

Wu, Albert M. The Molecular Immunology of Complex Carbohydrates—2, Kluwer Academic/Plenum Publishers, New York. (2001).

Wybourne, M. N. et al. "Creation of biomolecule arrays by electrostatic immobilization on electron-beam-irradiated polystyrene thin films." Nanotechnology 7:302-305. (1996).

Wyman, George M. "The CIS-Trans Isomerization of Conjugated Compounds." Quartermaster Research and Development Center, Natick, MA. (Feb. 14, 1955).

Yang, Zhihao et al. "Protein Interactions with Poly(ethylene glycol) Self-Assembled Monolayers on Glass Substrates: Diffusion and Adsorption." Langmuir, 15:8405-8411. (1999).

Yang, Zhongping and Ashutosh Chilkoti. "Microstamping of a Biological Ligand onto an Activated Polymer Surface." Adv. Mater., 12(6):413-417. (2000).

Yang, Zhongping et al. "Molecular Imaging of a Micropatterned Biological Ligand on an Activated Polymer Surface." Langmuir, 16:7482-7492. (2000).

Yang, Zhongping et al. "Preparation and Characterization of Mixed Monolayer Assemblies Composed of Thiol Analogues of Cholesterol and Fatty Acid." Langmuir, 13:3210-3218. (1997).

Ye, Bihui H. et al. "The BCL-6 proto-oncogene controls germinal-centre formation and Th2-type inflammation." Nature Genetics, 16:161-170. (Jun. 16, 1997).

Yin, Yadong et al. "Template-Assisted Self-Assembly: A Practical Route to Complex Aggregates of Monodispersed Colloids with Well-Definied Sizes, Shapes, and Structures." J. Am. Chem. Soc., 123:8718-8729. (2001).

Zagrobelny, JoAnn et al. "Steady-State and Time-Resolved Fluorescence Investigations of Pyrene Excimer Formation in supercritical CO2." J. Am. Chem. Soc., 114:5249-5257. (1992).

Zemanian, Thomas S. et al. "Deposition of Self-Assembled Monolayers in *Mesoporous Silica* from from Supercritical Fluids." Langmuir, 17:8172-8177. (2001).

Zhang, Huiqi et al. "Synthesis of Anthracene End-Capped Poly(methyl methacrylate)s via Atom Transfer Radical Polymerization and Its Kinetic Analyses." Macromolecules, 35:2261-2267. (2002).

Zhang, Lifeng and Adi Eisenberg. " Multiple Morphologies of 'Crew-Cut' Aggregates of Polystyrene-b-poly(acrylic acid) Block Copolymers." Science, 268:1728-1731. (Jun. 23, 1995).

Zhang, Qi et al. "Determination of locations of sulfur, amide-nitrogen and azo-nitrogen in self-assembled monolayers of alkanethiols and azobenzenethiols on Au(111) and GaAs (100) by angle-resolved X-ray photoelectron spectroscopy." Surface Science, 440:142-150. (1999).

Zhao, Bin et al. "Nanopattern Formation from Tethered PS-b-PMMA Brushes upon Treatment with Selective Solvents." J. Am. Chem. Soc., 122:2407-2408. (2000).

Zhao, Xiao Kang et al. "Size quantization in Semiconductor Particulate Films." J. Phys. Chem., 95:3716-3723. (1991).

Zharnikov, M. et al. "Modification of Alkanethiolate Monolayers by Low Energy Electron Irradiation: Dependence on the Substrate Material and on the Length and Isotoopic Composition of the Alkyl Chains." Langmuir, 16:2697-2705. (2000).

Andrade J.D. *Surface interfacial aspects of biomedical polymer* v1 1985, Plenum Press, New York, Chpt. 5, p. 178.

Ito H.; Ueda M.; Ebina M.; "Copolymer Approach to Design of sensitive Deep-UV Resist Systems with High Thermal Stability and Dry Etch Resistance," Polymers in Microlithography: Materials and processes; ACS Symposium Series 412; American Chemical Society: Washington, DC, 1989; p. 57.

Paul et al., "Synthesis of Ultrathin films of Polyacrylonitril by photoinitiated polymerization from Self-assembled monolayers on Gold," Langmuir, vol. 18(23), pp. 8719-8723 (2002).

Prescher et al., "Synthesis of liquid-crystalline poly(meth) acrylates with 4-trifluoromethoxy-azobenzene mesogenic side-groups," J. Fluorine Chem. vol. 74, pp. 185-189 (1995).

Valenzeno et al. ,"Membrane Photomodification and its use to study reactive oxygen effects," .; *Photochemistry and Photophysics*, Chapter 4., pp. 137-191, 1990, CRC Press. Inc.

Saminathan et al., "Synthesis and characterization of main-chain liquid-crystalline polymers containing a p-phenyleneazo group," Macromolecules, 26 (25), pp. 7103-7105 (1993).

International Search Report mailed on Jul. 12, 2005 for International Application No. PCT/US04/42363 filed Dec. 16, 2004.

Written Opinion mailed on Jul. 12, 2005 for International Application No. PCT/US04/42363 filed Dec. 16, 2004.

Wolf et al., "end-group molecular order in Self-assembled monolayers," J. Phys. Chem, vol. 99, pp. 7102-7107 (1995).

Abbott N. J.; Using finite element analysis to calculate the shapes of geometrically confined drops of liquid on patterned, self-assembled monolayers: a new method to estimate excess interfacial free energies .gamma.sv-.gamma.sl, J.Am Chem. Soc., vol. 116, pp. 290-294 (1994).

Douvas et al., "Photolithographic patterning of proteins with photoresists processable under biocompatible conditions," J. Vac. Sci Technol. B., vol. 19(6), pp. 2820-2824 (Nov./Dec. 2001).

Pan et al., "Surface micropatterning of biomolecules through photolithography on block copolymer brushes," Polymer Preprint< vol. 44, pp. 500-501 (2003).

* cited by examiner

PHOTOACID GENERATION

MICROSCOPE
AN IX70 INVERTED IMAGE MICROSCOPE FOR FLUORESCENT LIGHT OBSERVATION.

VIBRATION-FREE STAND
A SPECIAL PNEUMATIC TYPE STAND FOR ELIMINATING VIBRATION.

2-3 IX70 SYSTEM

TRANSMITTED LIGHT DETECTOR (OPTION)
THIS UNIT IS USED TO OBTAIN TRANSMITTED LIGHT IMAGES.

COMPRESSOR
SUPPLIES AIR TO THE VIRBRATION-FREE STAND.

MICROPATTERNING OF MOLECULAR SURFACES VIA SELECTIVE IRRADIATION

This application is a continuation of International Patent Application No. PCT/US2003/004214, filed Feb. 13, 2003, the disclosure of which is incorporated by reference herein in its entirety.

BACKGROUND OF THE INVENTION

1. Field of the Invention

This invention relates to micropatterning of molecular surfaces, and in particular to micropatterning of the surfaces of polymeric materials and of self-assembled monolayers via selective irradiation.

2. Background Information

The term "surface micropatterning" refers to the creation of spatially heterogeneous surfaces with different chemical functionality, hydrophobicity or morphology with micron or submicron feature sizes. Surface micropatterning provides an excellent technique for the study of surface-induced phase separation of: thin film polymer blends and block copolymers, intermolecular surface forces between heterogeneous surfaces, object 2D self-assembly processes, nucleations and crystallizations, and excess interfacial free energy phenomena. Patterned surfaces can be also used as universal templates to assist self-assembly and selective deposition of materials such as: polymer and inorganic colloidal particles, nanoparticles, and biomolecules such as DNA, proteins, peptides and cell biomolecules. Surface patterning has been performed on different surfaces using, for example, homopolymers, polymer brushes, hydrogels, self-assembled monolayers (SAMs), or Langmuir-Blodgett films. Different strategies have been used, including microcontact printing (μCP), X-ray irradiation, ion and e-beam direct writing, and other mechanical and photochemical techniques.

However, it remains desirable for the patterning method to provide high pattern feature resolution and to be biocompatible, thereby allowing patterning of biomolecular surfaces as well as patterning of surfaces with biomolecules. Surface patterning using well-defined photochemical processes is also advantageous since it opens the opportunity for selective physisorption and covalent bonding of external ligands. It would therefore be desirable to provide a surface patterning method and system having all of the above characteristics.

SUMMARY OF THE INVENTION

Accordingly, it is an object of the invention to provide a method for surface micropatterning. The method in a first embodiment includes forming on a surface containing a first polymer a first coating containing a second polymer having first functionalities capable of being converted to second functionalities by exposure to an acid. A second coating containing a photoacid generator is formed on the first coating. The second coating containing the photoacid generator is selectively irradiated in one or more regions thereof with radiation having a spatially varying intensity pattern to generate an acid in each irradiated region of the second coating. The acid converts the first functionalities of each region of the second polymer underlying a respective irradiated region of the second coating to second functionalities. A first molecular patterned surface containing one or more regions of the first functionalities and one or more regions of the second functionalities is formed.

The method in another embodiment includes forming on a surface on a substrate a self-assembled monolayer of organic groups, where each organic group contains a first functionality capable of being converted to a second functionality by exposure to an acid. A coating containing a photoacid generator is then formed on the self-assembled monolayer. The coating containing the photoacid generator is selectively irradiated in one or more regions thereof with radiation having a spatially varying internsity pattern to generate an acid in each irradiated region of the coating. The acid converts the first functionalities of the organic groups of each region of the self-assembled monolayer underlying a respective irradiated region of the coating to the second functionalities. A first molecular patterned surface containing one or more regions of the first functionalities and one or more regions of the second functionalities is formed.

The method in another embodiment includes forming on a surface on a substrate a self-assembled monolayer of organic groups, where each organic group contains a first functionality capable of being converted to a second functionality by exposure to an acid. A coating containing a first polymer and a photoacid generator is formed on the surface of the substrate. The coating is selectively irradiated in one or more regions thereof with radiation having a spatially varying internsity pattern to generate an acid in each irradiated region of the coating. The acid converts the first functionalities of the organic groups of each region of the self-assembled monolayer underlying a respective irradiated region of the coating to the second functionalities. The coating is then removed. A first molecular patterned surface containing one or more regions of the first functionalities and one or more regions of the second functionalities is formed.

The method of the invention allows patterning of various types of molecular surfaces. The surfaces may be patterned to have regions with different chemical functionalities, including carboxyl groups and alkyl groups. The patterned surface may also be used as a template to bind or immobilize biomolecules at precise locations. Thus, the patterned surfaces obtained from the invention may be used as templates to assist the selective deposition of a variety of external ligands and the creation of a selectively functionalized surface.

The method of the invention has several advantages over known methods for surface micropatterning. The method of the invention introduces surface functional groups available for subsequent micropatterning while confining the formed pattern to the surface. The conversion of first functionalities to second functionalities proceeds with great efficiency, so that UV exposure time can be of the order of a few seconds. Moreover, the method of the invention is especially desirable for the patterning of a surface with biomolecules or of a biomolecular surface since it does not entail the risk of reducing biological activity. This is due to the biocompatibility of the surface functionalities formed. Similarly, UV exposure is carried out before surface immobilization of a biomolecule and therefore does not have any negative effect on bioactivity. The patterning method of the invention also overcomes the low surface density limitation which other techniques, such as micro-contact printing (μCP), required for the patterning of biomolecules on polymers. Furthermore, modifications induced by ultraviolet light or other photochemical approaches are known to provide selective physisorption, and selective covalent bonding of external ligands, in contrast to techniques such as surface modification of polymers and self-assembled monolayers ("SAMs") achieved by techniques such as X-ray, laser, ion and e-beam irradiation or by strong chemical oxidation methods, all of which lead to the inhomogeneous distribution of multiple functional groups at the surface, thereby reducing the selectivity required in subsequent derivatization steps. The method of the invention also removes the limitation of susceptibility to UV light for certain photochemical approaches which require the irradiation of molecules having photolabile groups. The method of the invention may also be used to pattern biomolecules such as cell adhesion promoters such as RGD ligands, the patterning of which may be used for spatially directed cell growth.

BRIEF DESCRIPTION OF THE FIGURES

FIG. 7B shows the fluorescence intensity line profile of line 70 of FIG. 7a.

DETAILED DESCRIPTION

Figure 1A:
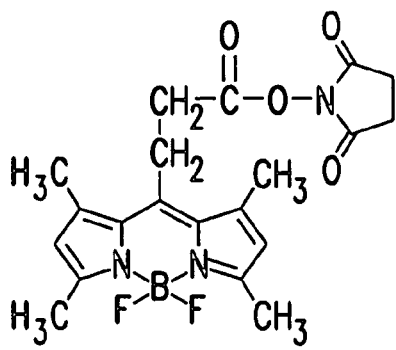
FIGS. 1A-1F illustrates the molecular structure of exemplary imaging agents used in exemplary embodiments of the present invention.

The self-assembled monolayers of the invention may be formed on a variety of surfaces. These include, for example, surfaces made of plastic materials, insulators, semiconductors, or conductors, such as metals. The surface may be the surface on a substrate such as glass, which may be in the form, for example, of a slide or coverslip. Another exemplary material of a surface on a substrate is gold, which may be in the form, for example, of a sheet, leaf, or nanoparticles. The gold surface may be prepared, for example, by evaporation of gold onto a surface of a suitable underlying substrate, such as a silicon wafer surface or a glass slide. The surfaces may be cleaned prior to use in the invention by treatment with a suitable cleaning agent. For example, a glass surface may be suitably cleaned and etched by treatment with an alkaline mixture, such as a mixture of a base in an anhydrous or aqueous alcohol. An exemplary mixture is a solution of sodium hydroxide in aqueous ethanol.

The surface containing the first polymer on which the coating containing the second polymer is formed may be a surface consisting essentially of the first polymer. The surface containing the first polymer may be the surface of a substrate. The substrate may contain the first polymer and a solvent in which the polymer is mixed, or may consist essentially of the first polymer. The first polymer may be a solid or may be in melt form. In one exemplary embodiment, the first polymer is a polyolefinic polymer. Exemplary polyolefinic polymers include polystyrene ("PS") and PS having carbon atoms substituted with functional groups such as amino, carboxy and alkoxy functional groups. The surface containing the first polymer may be the surface of a coating containing the first polymer which is a coating formed on another surface supported by a substrate, wherein the other surface may be any of the surfaces used for the formation of a self-assembled monolayer as previously described, and the coating may consist essentially of a polyolefinic polymer such as, for example, PS, PS having carbon atoms substituted with functional groups such as amino, carboxy and alkoxy functional groups, or ω-triethoxy-PS.

A variety of methods may be used to form a coating on a surface of a substrate, on a surface of a coating, or on an underlying self-assembled monolayer. As an example, a coating containing a polymer may be formed by adsorbing the polymer on a surface on a substrate, or by spin coating, extrusion coating, roll coating, or slot coating the polymer onto the surface on a substrate, or the coating may be spin coated, roll coated or slot coated from a solution of the polymer onto the surface on a substrate, onto the surface of a coating, or onto an underlying self-assembled monolayer. In an exemplary embodiment, the coating containing the polymer is formed by spin coating the coating onto the surface on a substrate, onto the surface of a coating, or onto an underlying self-assembled monolayer. Hereinafter, a coating C1 formed on a coating C2 is denoted by "C1/C2" and a coating C formed on a surface supported by a substrate S is denoted by "C/S." Analogously, a plurality of successively formed coatings C1, C2, Cn is denoted by "C1/C2/ . . . /Cn."

As used herein, the term "photoacid generator" ("PAG") is used to denote a compound that generates an acid by being exposed to radiation. The radiation may be, for example, ultraviolet light or visible light. In an exemplary embodiment, the radiation is ultraviolet light. The light intensity may be, for example, of about 10 mJ/cm². Photoacid generators may include, for example, triarylsulfonium perfluoroalkylsulfonates (hereinafter triarylsulfonium "triflates"), described by structure I in Scheme 1, mixtures containing compounds of structure I and water, diaryliodonium perfluoroalkylsulfonates (diaryliodonium "triflates"), described by structure II in Scheme 1, and mixtures containing structure II and water. Triphenylsulfonium trifluoromethylsulfonate and bis-(4-t-butylphenyl)iodonium perfluorobutanesulfonate are exemplary photoacid generators. The pH of the photogenerated acid is a pH sufficient to convert the first functionalities to the second functionalities. For example, trifluoroacetic acid, which is photogenerated from a triflate, and which has a pKa of 0.67±0.20, is a suitable photogenerated acid.

In one embodiment, the first functionalities capable of being converted to second functionalities by exposure to an acid may be non-acidic functionalities capable of being converted to acidic functionalities.

As used herein, an "acidic functionality" is a functional group containing a hydrogen attached to a heteroatom, such as, for example, O or S, where the hydrogen may be removed by a strong base, such as an alkali metal hydroxide. "Acidic functionalities" include, for example, carboxylic acid groups (—COOH), sulfonic acid groups (—SO₃H), sulfinic acid groups (—SO₂H), and thiocarboxylic acid groups (—COSH).

As used herein, a "non-acidic functionality" is a functional group that does not contain a hydrogen attached to a heteroatom where the hydrogen may be removed by a strong base. The non-acidic functionalities may include, for example, esters of carboxylic acids, anhydrides of carboxylic acids, primary, secondary and tertiary amides of carboxylic acids, nitriles, esters of sulfonic acids, anhydrides of sulfonic acids, primary, secondary and tertiary amides of sulfonic acids, esters of thiocarboxylic acids, and esters of sulfinic acids. In one exemplary embodiment, the non-acidic functionalities are t-butyl carboxylic esters, and the acidic functionalities to which the t-butyl carboxylic esters are converted by treatment with an acid are carboxylic acid groups. In another exemplary embodiment, the non-acidic functionalities are esters, primary amides, secondary amides, or tertiary amides of carboxylic acids which do not contain a carbonyl group α to the carbonyl carbon of the esters, primary amides, secondary amides, or tertiary amides.

In another embodiment, the first functionalities capable of being converted to second functionalities by treatment with an acid may be functionalities selected from the group consisting of ether functionalities capable of being converted to hydroxy functionalities by treatment with an acid, secondary amino functionalities capable of being converted to primary amino functionalities by treatment with an acid, tertiary amino functionalities capable of being converted to secondary amino functionalities by treatment with an acid, and tertiary amino functionalities capable of being converted to primary amino functionalities by treatment with an acid.

Figure 18:
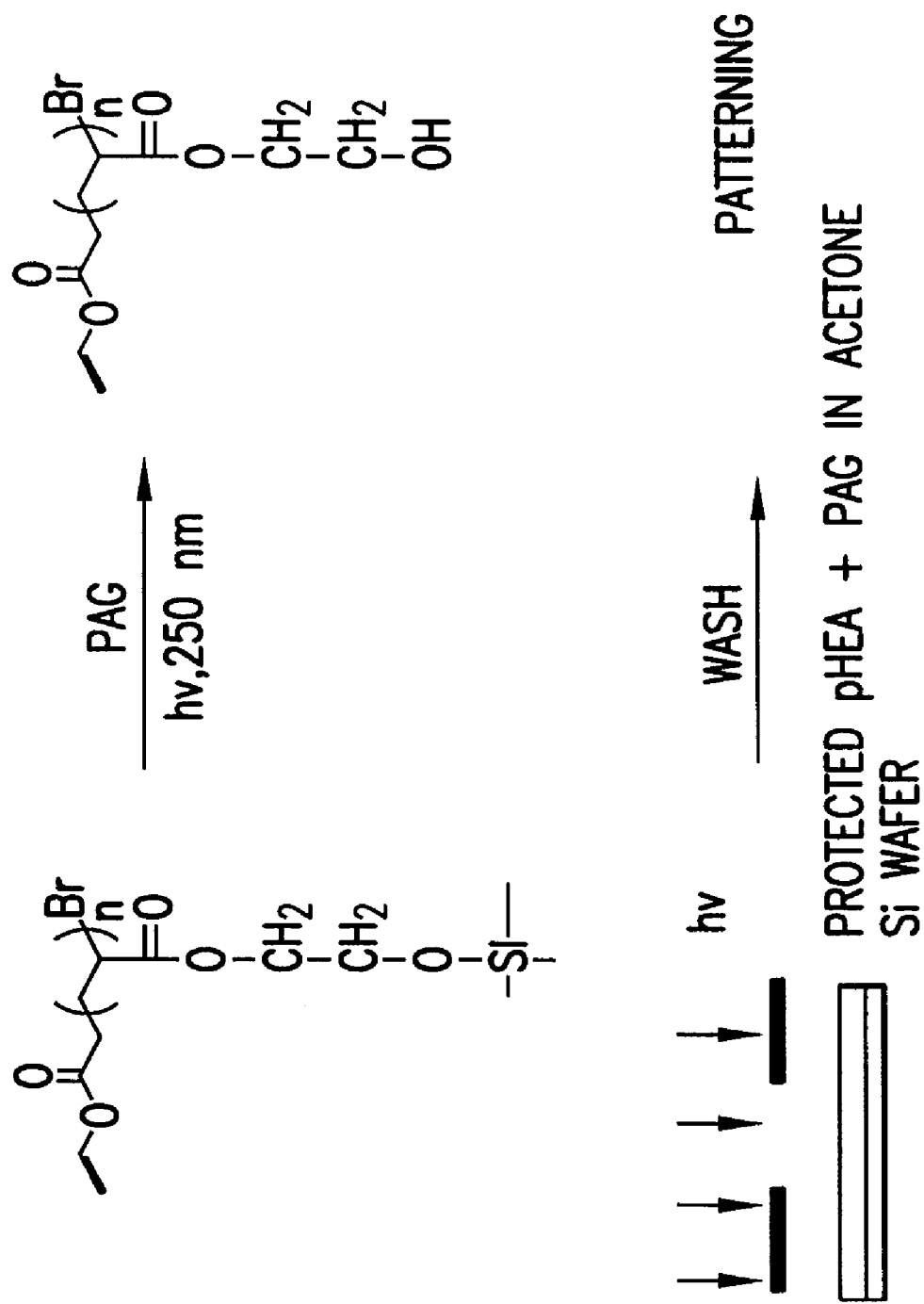
FIG. 18 illustrates the patternwise treatment of a trimethylsilyl ether-terminated hydroxyethyl polyacrylate chain with ultraviolet radiation to form a hydroxy-terminated polymer chain.

The ether functionalities capable of being converted to hydroxy functionalities by exposure to an acid include, for example, —CR₁R₂—O—CR₃R₄—Ar groups, where each of R₁, R₂, R₃ and R₄ may be independently hydrogen, an alkyl group, preferably a C₁-C₂₀ alkyl group, or an optionally substituted aryl group, and Ar is an optionally substituted aryl group. Exemplary ether functionalities include silyl ether groups, benzyl ether groups, and tetrahydropyranyl ether groups. A representative exemplary ether functionality is a trialkylsilyl ether group, such as the trimethylsilyl ether group. FIG. 18 illustrates selectively irradiating a coating of a trimethylsilyl ether-terminated hydroxyethyl polyacrylate chain with ultraviolet light through a patterned mask to permit selective removal of the trimethylsilyl groups in regions of the coating irradiated by the ultraviolet light and thereby form a patterned coating of a hydroxy-terminated polymer chain.

The formation of the coating containing the polymer containing first functionalities on the surface containing the first polymer may include tethering the polymer containing the first functionalities to the surface. The polymer containing the first functionalities may be tethered by physisorption of one end of the polymer to the surface. Alternatively, the polymer may be tethered by entanglement of one end of the polymer with the first polymer in the surface.

The polymer containing first functionalities may be, for example, a polyacrylic polymer, such as a polyacrylate or

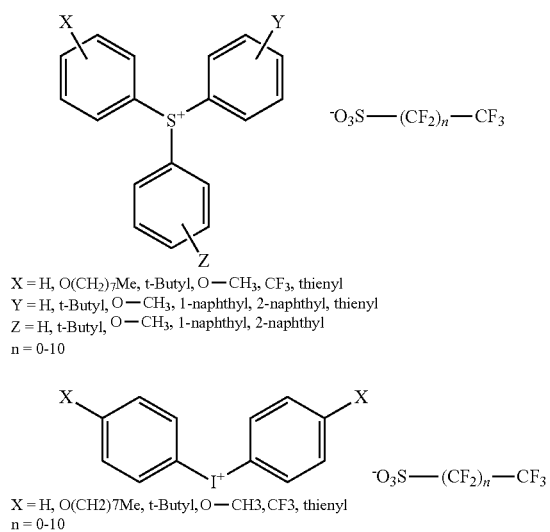

Scheme 1

I

X = H, O(CH₂)₇Me, t-Butyl, O—CH₃, CF₃, thienyl
Y = H, t-Butyl, O—CH₃, 1-naphthyl, 2-naphthyl, thienyl
Z = H, t-Butyl, O—CH₃, 1-naphthyl, 2-naphthyl
n = 0-10

II

Figure 2A:
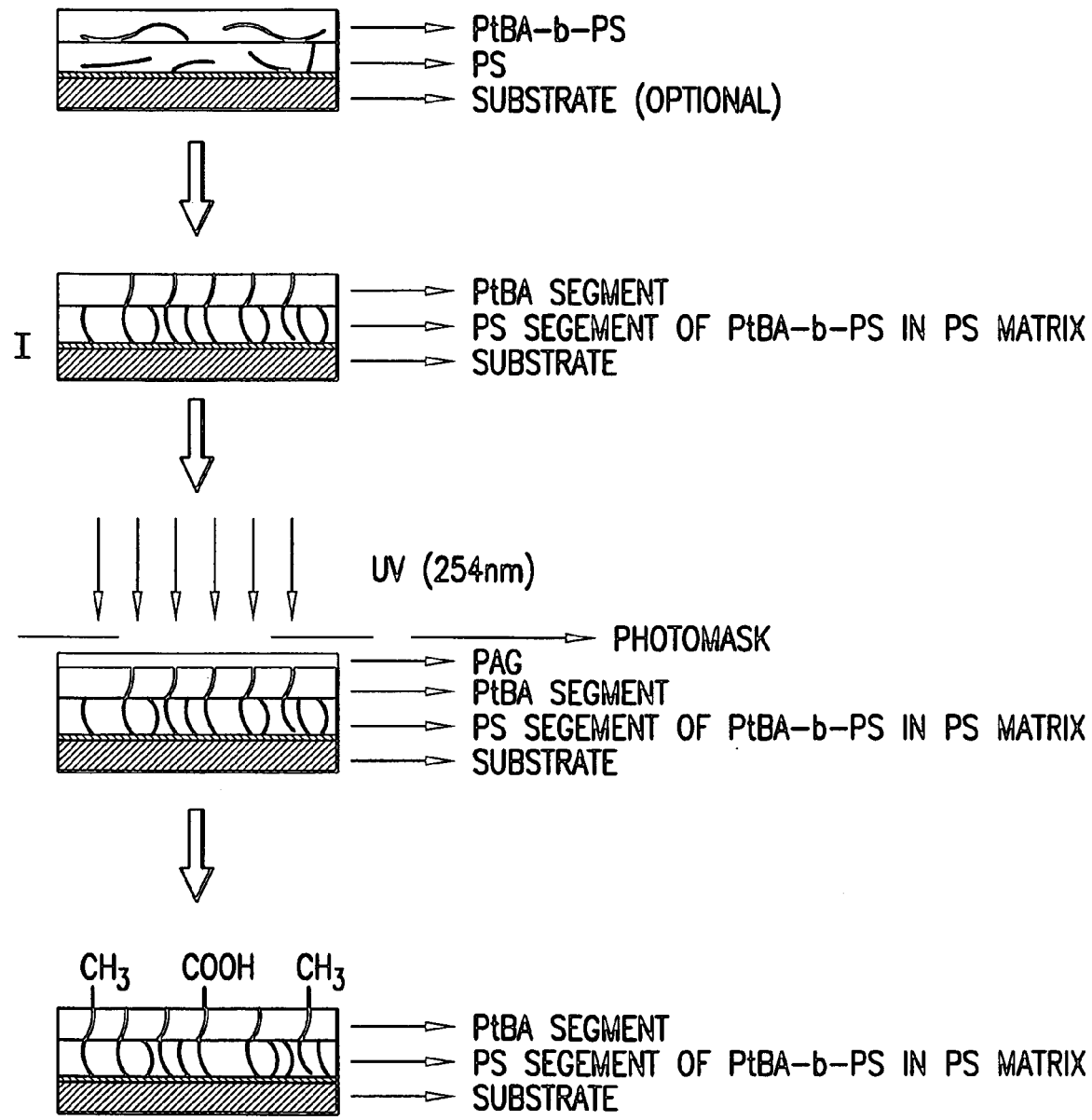
FIG. 2A illustrates a schematic approach to the patterning of block copolymers of poly-t-butyl acrylate ("PtBA") and Polystyrene ("PS") using masked irradiation.
Figure 2B:
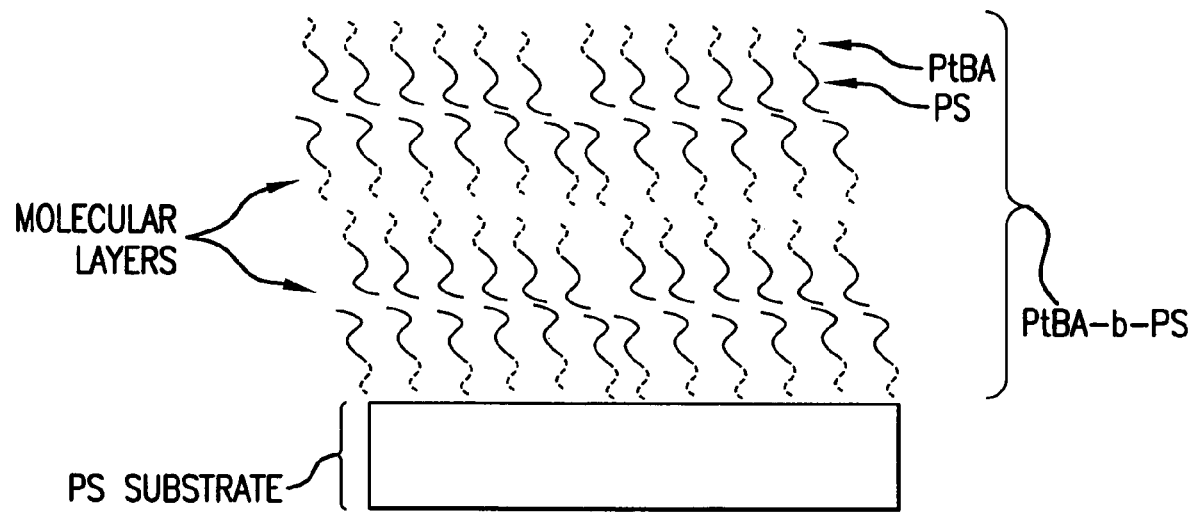
FIG. 2B illustrates the formation of a plurality of molecular layers of block copolymers of PtBA and PS ("PtBA-b-PS") on a PS coating.

X = H, O(CH2)7Me, t-Butyl, O—CH3, CF3, thienyl
n = 0-10 polyacrylamide. The polymer containing first functionalities may be, for example, a statistical copolymer containing acrylic units, such as acrylamide units or acrylate units like t-butyl acrylate units, and monomeric units X. The polymer containing first functionalities may also be, for example, a block copolymer containing one or more blocks of acrylic units, such as acrylate or acrylamide units, and one or more blocks of monomeric units X. The block copolymer may contain polymeric chains in which one end of each chain contains an end block of monomeric units X, in which one or more monomeric units X of the end block are physisorbed to the surface on which the coating containing the polymer containing first functionalities is formed. Alternatively, the block copolymer may contain polymeric chains in which one end of each chain contains an end block of monomeric units X, in which one or more monomeric units X of the end block are entangled with the first polymer in the surface on which the coating containing the polymer containing first functionalities is formed. Each of a plurality of the polymeric chains of the block copolymer, or polymer "brushes," contains an end block of monomeric units X at a first end of each chain, where the first end of each chain is tethered to the surface, as shown in structure I in the exemplary embodiment of FIG. 2A. The polymer brushes are oriented about perpendicular to the surface and form a molecular layer. Each of the plurality of polymer brushes also contains an end block of acrylic units at a second end of each brush. The acrylic units at a second end of each brush form a molecular surface of the molecular layer. Additional molecular layers of polymer brushes may also form, resulting in the plurality of molecular layers shown schematically in FIG. 2B. In each additional molecular layer, a plurality of units X is adjacent to the molecular surface formed by a plurality of end blocks of acrylic units of the molecular layer beneath it. The monomeric units X are chosen so that a polymer of monomeric units X has a surface tension which is sufficiently different from the surface tension of a polymer of the polyacrylic units to allow self-assembly of the polymer brushes into the molecular layer of FIG. 2A or the plurality of molecular layers of FIG. 2B. For example, if the X units are styrene units, the styrene units are the surface active block, as shown in FIG. 2B. This is believed to be due to the lower surface tension of PtBA ($\sigma$(PtBA)) as compared to PS. PtBA is believed to have a surface tension a similar to poly-t-butyl methacrylate ("PtBMA") and poly-b-butyl acrylate ("PnBA"). Since $\sigma$(PS)=40.7 dyne/cm, $\sigma$(PtBMA)=30.4 dyne/cm, and $\sigma$(PnBA)=30.7 dyne/cm, according to J. Brandup and E. H. Immergut, *Polymer Handbook*, 4$^{th}$ ed., John Wiley&Sons Inc., New York (1999), $\sigma$(PtBA) is believed to be smaller than $\sigma$(PS).

Figure 3A:
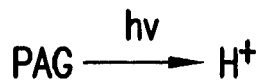
FIG. 3A illustrates the deprotection of PtBA-b-PS catalyzed by photochemically generated acid to form a polyacrylic acid-PS block copolymer ("PAA-PS").
Figure 3A:
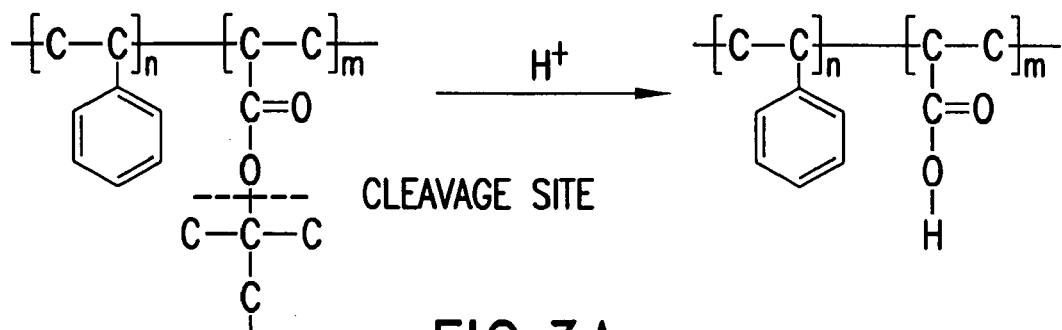

In one exemplary embodiment, the polymer brush is a block copolymer comprising one or more blocks of acrylic units and one or more blocks of styrene units. An exemplary polymer brush is a block copolymer comprising one or more blocks of t-butyl acrylate units and one or more blocks of styrene units, or a Polystyrene-Poly(t-butyl acrylate) block copolymer—hereinafter "PtBA-b-PS". A molecular weight (MW) larger than the critical entanglement MW for PS, which is 10.6 K, is desirable for the PS in the underlying element and for the PS block in the PtBA-b-PS block copolymer of the coating formed on the element in order to improve the anchoring strength. For example, MW values between 5K and 1,000K in both the PS in the underlying element and the PS block in the PtBA-b-PS block copolymer may be used. A symmetric block copolymer may be used, in which the volume fraction of each polymer block is about ½ or in which the molecular weight of each polymer block is about equal, to favor lamella formation. In exemplary embodiment, each of the PS and the PtBA blocks in the block copolymer has a molecular weight of about 200K. FIG. 3A illustrates the deprotection of PtBA-b-PS catalyzed by photochemically generated acid to form a polyacrylic acid—PS block copolymer ("PAA-b-PS").

In the embodiment where the polymer containing the first functionalities is a statistical copolymer, the copolymer may contain polymeric chains in which one end of each chain contains one or more monomeric units which are physisorbed to the surface on which the coating containing the polymer containing first functionalities is formed. The copolymer may be, for example, a statistical copolymer comprising a plurality of t-butyl acrylate units and a plurality of styrene units, shown in FIG. 2C as "PtBA-s-PS".

Figure 2C:
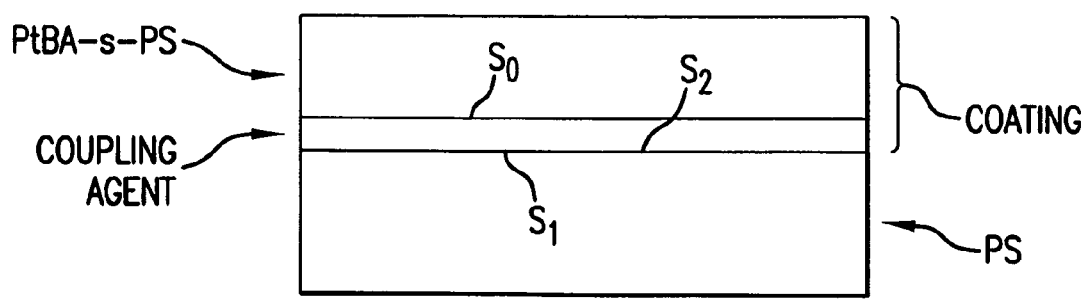
FIG. 2C shows the formation of a coating containing a coupling agent which is tethered to a surface.

The coating having the polymer containing first functionalities formed on the surface having the first polymer may also contain a coupling agent. The coupling agent may facilitate the formation of the coating having the polymer containing first functionalities on the surface having the first polymer in the case where the polymer containing first functionalities is not readily tethered to the surface. The coupling agent assembles at the surface, as shown in FIG. 2C. The coupling agent may be tethered to the surface, for example, by physisorption of a first end of the coupling agent to the surface, by entanglement of a first end of the coupling agent with the first polymer in the surface, or by covalent bonding between a functional group at a first end of the coupling agent and a functional group at the surface. Accordingly, the coupling agent in the coating containing the polymer containing first functionalities forms an inner surface $S_i$ in FIG. 2C which contacts the surface $S_2$ having the first polymer. The coupling agent also forms an outer surface $S_o$ in FIG. 2C. The polymer containing first functionalities may be physisorbed on the outer surface $S_o$ or entangled with molecules of the coupling agent at the outer surface $S_o$ or covalently bound at the surface So. As a result, the coupling agent acts as a "glue" between the surface and the polymer containing first functionalitites, and thereby facilitates the formation of the coating containing the polymer containing first functionalities on the surface in the case where the polymer containing first functionalities is not readily tethered to the surface. The coupling agent may be a polymeric compound, such as a block copolymer. For example, the coupling agent may be a block copolymer containing one or more blocks of acrylic units and one or more blocks of monomeric units X, where X is as previously defined above.

In another embodiment of the invention, a self-assembled monolayer of organic groups may be formed on a surface on a substrate. As used herein, the "organic groups" of the self-assembled monolayer may be any groups capable of self-assembly and which are formed from compounds having at least one functionality capable of forming a covalent bond at the surface on the substrate. The organic groups may include groups formed from compounds having a hydrogen bonded to a heteroatom by removal of the hydrogen. Suitable compounds having a hydrogen bonded to a heteroatom may include, for example, any compound having the general formula H—W-Sp-ff, where W is a heteroatom a group containing at least one heteroatom, which may be, for example, S, O, NH, or NR, where R is an optionally substituted alkyl group, preferably a $C_1$-$C_{20}$ alkyl group, or an optionally substituted aryl group, preferably a phenyl group; "Sp" is any spacer group, such as an alkylene chain, which may be, for example, a $C_5$-$C_{50}$ alkylene chain in which one or more carbon atoms may be replaced with a heteroatom, a group containing one or more heteroatoms, an arylene group, such as 1,4-phenylene, or a combination thereof; and "ff" is the first functionality.

Figure 3B:
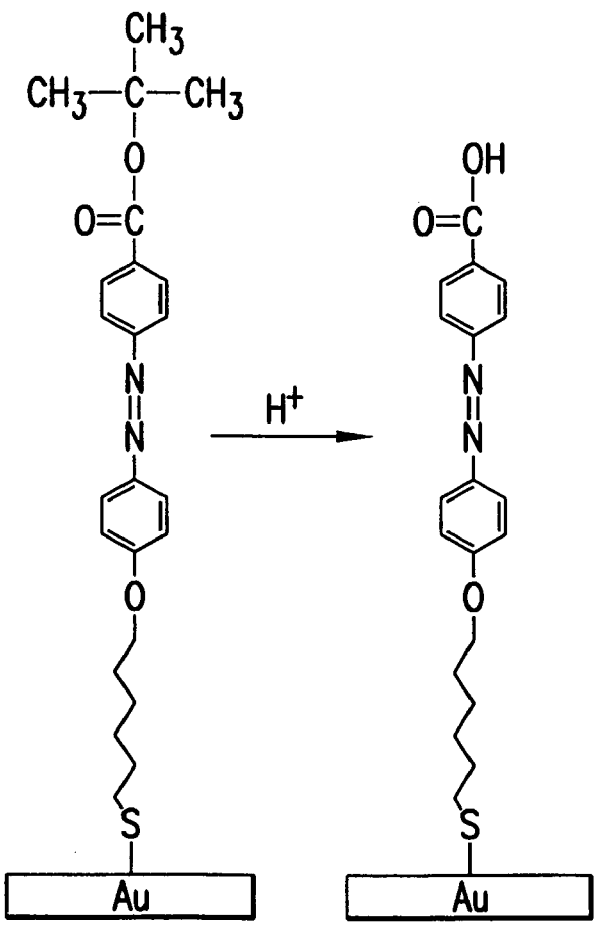
FIG. 3B illustrates the deprotection of a self-assembled monolayer of HS—$(CH_2)_6$—O—$C_6H_4$—N=N—$C_6H_4$—COO—$C(CH_3)_3$ ("SAM-azo-tBu") to form a self-assembled monolayer of HS—$(CH_2)_6$—O—$C_6H_4$—N=N—$C_6H_4$—COOH ("SAM-azo-COOH").

The organic groups formed from these compounds have the general formula —W-Sp-ff, where W and Sp are as defined above. The reaction between the organic compound and the substrate may be performed by immersing the substrate, such as a metal substrate, in a solution of the organic compound in an anhydrous or aqueous organic solvent, such as ethanol or tetrahydrofuran. Exemplary organic compounds include esters of carboxylic acids; anhydrides of carboxylic acids; primary, secondary and tertiary amides of carboxylic acids; nitriles; esters of sulfonic acids; anhydrides of sulfonic acids; primary, secondary and tertiary amides of sulfonic acids; esters of thiocarboxylic acids; and esters of sulfinic acids, having a H—W— group, where W is defined as above. Representative examples of the organic compounds include compounds having the general formula H—W-Alk-Z—$Ar_1$—$(Y=Y)_n$—$Ar_2$—$COOR_1$, where W is as defined above; the -Alk- group is a $C_m$ alkylene chain, where m is preferably between 5 and 20; —Z— is a heteroatom or a group containing a heteroatom, such as O, S, or where $R^2$ is hydrogen or a $C_{1-20}$ alkyl group or an aryl group such as phenyl; each of —$Ar_1$— and —$Ar_2$— is independently an arylene group, such as a 1,4-disubstituted phenylene; Y is any atom or group capable of forming an (E)- or (Z)-double bond with another Y atom or group, such as —N or —CH; n is preferably between 1 and 20; and $R_1$ is hydrogen or a $C_{1-20}$ alkyl group or an aryl group such as phenyl. Exemplary organic compounds include the (E) and (Z) isomers of HS—$(CH_2)_6$—O—$C_6H_4$—N=N—$C_6H_4$—COOH (hereinafter "azo-COOH") and the (E) and (Z) isomers of HS—$(CH_2)_6$—O—$C_6H_4$—N=N—$C_6H_4$—COO—$C(CH_3)_3$ (hereinafter "azo-tBu"). In azo-COOH and azo-t-Bu, each of the —$C_6H_4$— groups is para-disubstituted. The self-assembled monolayers of organic groups which are formed by reacting the surface on the substrate with azo-COOH and azo-t-Bu, respectively, are hereinafter referred to as "SAM-azo-COOH" and "SAM-azo-t-Bu". FIG. 3B illustrates the deprotection of SAM-azo-tBu catalyzed by photochemically generated acid to form SAM-azo-COOH.

In one embodiment of the invention where the organic groups of the self-assembled monolayer contain first functionalities which may be converted to second functionalities by exposure to an acid, a coating containing a first polymer and a photoacid generator ("PAG") is formed on the self-assembled monolayer. The coating formed on the self-assembled monolayer may be a coating in which the first polymer and the PAG are dissolved. Alternatively, the first polymer may be in the form of a melt in which the PAG is admixed. Exemplary polyolefinic polymers include PS, triethoxy-terminated PS, and derivatized PS. After conversion of one or more selected regions of the self-assembled monolayer having the first functionalities to the second functionalities by selectively irradiating the one or more regions with radiation having a spatially varying intensity pattern, the coating formed on the self-assembled monolayer still contains the first polymer and may contain an excess of PAG. The coating is then removed to uncover the patterned surface (i.e., the surface resulting from selectively irradiating the one or more regions with radiation having a spatially varying intensity pattern) of the self-assembled monolayer. Removal of the coating may be accomplished, for example, by treating the coating with an organic polar or non-polar solvent in which the coating is soluble. In an exemplary embodiment, the organic solvent is a non-polar solvent, such as toluene.

Selective irradiation of one or more regions of the coating may be achieved in a variety of ways in which the coating is exposed to radiation having a spatially varying intensity pattern. Selective irradiation may be achieved, for example, by using a contact mask having a desired pattern of transparent and opaque regions and having a radiation source. The contact mask is positioned on the coating, between the coating and the radiation source, such that the radiation passing through the contact mask and impinging on the coating has the spatially varying intensity pattern, as defined by the pattern of the contact mask. Alternatively, the contact mask may be replaced by a proximity mask having the desired pattern of transparent and opaque regions disposed between the radiation source and the coating, near but not touching the coating. Radiation from the source passing through the proximity mask and impinging on the coating has the spatially varying intensity pattern, as defined by the patter of the proximity mask.

In another alternative for selectively irradiating regions of the coating with radiation having a spatially varying interrnsity pattern, a projection mask having the desired pattern of transparent and opaque regions is used in a conventional projection system providing a radiation beam for projecting the mask pattern onto the coating. The project mask pattern on the coating has the spatially varying intensity pattern, as defined by the patter of the projection mask. An advantage of this technique is that by varying the projection system, the projected mask pattern on the coating may be magnified or reduced so that the size of the projection mask need not be comparable to the size of the coating.

In still another alternative, no patterned mask is used. The coating is scanned by a beam of radiation having a relatively small cross-section in a predetermined pattern of scanning lines that provide substantially uniform coverage of the coating. The intensity of the radiation beam is modulated so that in each complete scan of the coating the integrated intensity of the radiation impinging on the coating has the desired spatially varying intensity pattern.

The radiation used may be ultraviolet light. The ultraviolet light may have a wavelength between 220 nm and 300 nm, preferably 254 nm, from a mercury vapor discharge.

Selective irradiation of regions of the coating containing a PAG generates an acid in the irradiated regions of the coating. In portions of the self-assembled monolayer underlying the irradiated regions of the coating, or in portions of another coating underlying the irradiated regions, the first functionalities are converted to second functionalities to form a first molecular patterned surface containing a plurality of the first functionalities and a plurality of the second functionalities in accordance with the spatially varying intensity pattern of the radiation. For example, as shown in FIG. 2A, the conversion of t-butyl ester groups to carboxylic acid groups in the irradiated regions leads to the formation of a patterned molecular surface having —COOH and —$CH_3$ groups in portions of the self-assembled monolayer or other coating underlying the irradiated regions. After exposure to ultraviolet light, the sample may be postbaked to facilitate the diffusion of the acid molecules and increase the rate of conversion of the first functionalities to the second functionalities in the irradiated regions.

Figure 10:
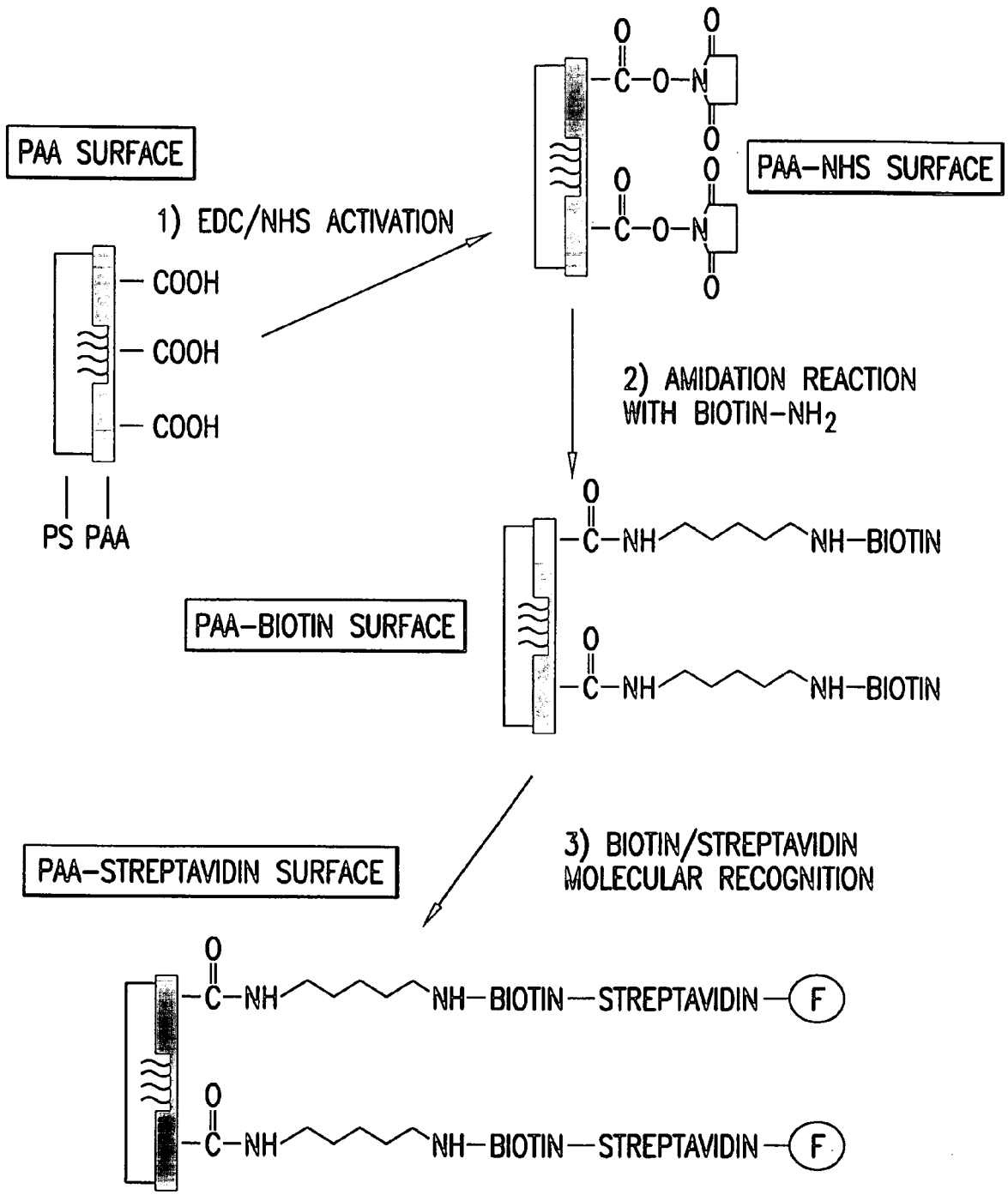
FIG. 10 illustrates the sequence for the micropatterning of surface carboxylic groups of PAA-b-PS/PS with N-(2-aminoethyl)biotinamide hydrobromide ("Biotin-$NH_2$") and subsequent molecular recognition by Alexa488-tagged Streptavidin ("Alexa488-Streptavidin").

In the embodiment of the invention in which a plurality of non-acidic functionalities are converted to a plurality of acidic functionalities, the acidic functionalities may be converted to acid derivative functionalities. The term "acid derivative functionalities" as used herein denotes functionalities obtained from the reaction of the acidic functionalities with a nucleophile and functionalities obtained from the reaction of the acidic functionalities with an activating agent to form intermediate functionalities which react with the nucleophile. The conversion of acidic functionalities to acid derivative functionalities forms a patterned molecular surface containing regions of non-acidic functionalities and regions of acid derivative functionalities. Representative acid derivative functionalities include, for example, ester groups; amide groups including primary amide, secondary amide, and tertiary amide groups; thioester groups; and hydroxamic acid groups. Each of the plurality of acid derivative functionalities may include a group capable of forming a covalent or non-covalent bond or a group capable of forming a hydrophobic interaction with a functional group of each of a plurality of biomolecules or biomolecular moieties. The group capable of forming a covalent or non-covalent bond with a functional group of a biomolecule or biomolecular moiety may be a group capable of forming one or more hydrogen bonds, such as, for example, —OH, —OR, —SH, —SR, —NH$_2$, —NHR, or —NR$_2$. The group capable of forming a hydrophobic interaction may be, for example, any group which does not have heteroatoms, such as an alkyl group. A plurality of covalent or non-covalent bonds may be formed between a group of one of the acid derivative functionalities capable of forming a covalent or non-covalent bond and a functional group of one of the biomolecules or biomolecular moieties. This leads to the formation of a patterned molecular surface which contains regions of non-acidic functionalities and regions of biomolecules or biomolecular moieties. The biomolecules or biomolecular entities may include any biomolecule or biomolecular entity capable of being immobilized to a molecular surface by specific or non-specific binding. Exemplary biomolecules includes streptavidin, Alexa488-tagged Streptavidin, bovine serum albumin ("BSA"), and fluorescein-5 isothiocyanate tagged BSA ("FITC-BSA"). For example, as shown in FIG. 10, the carboxylic acid functionalities of a first molecular surface may be converted by activation with EDC/NHS to form amide functionalities of a second molecular surface. Each amide functionality shown in FIG. 10 contains a biotinamide (—NH-Biotin) group which is capable of forming a hydrogen bond to a molecule of streptavidin, thereby forming a third molecular surface.

The effect of patterning may be characterized by a variety of techniques, including X-ray photoelectron spectroscopy (XPS), which monitors the change in surface chemistry following patterning; water contact angle measurements, which monitor the change in surface wetting property; and angle dependent XPS, which is used to measure the thickness of the uppermost molecular layer of polymer brushes and of the self-assembled monolayers.

A surface pattern may be imaged by a variety of imaging techniques, including fluorescence imaging, water condensation imaging, Scanning Electron Microscopy (SEM) imaging and XPS imaging. A variety of imaging agents may be used, such as organic dyes and fluorescent-tagged biomolecules. Exemplary imaging agents include 4,4-difluoro-1,3,5,7-tetramethyl-4-bora-3a,4a-diaza-s-indacene-8-propionic acid, succinimidyl ester (BODIPY® 493/503, SE, "Bodipy-ester"), 4,4-difluoro-5,7-dimethyl-4-bora-3a,4a-diaza-s-indacene-3-propionyl ethylenediamine hydrochloride (BODIPY® FL EDA, "Bodipy-NH$_2$"), N-(2-aminoethyl) biotinamide hydrobromide (hereinafter "Biotin-NH$_2$"), Alexa488-tagged Streptavidin ("Alexa488-Streptavidin"), and Fluorescein-5 isothiocyanate tagged Bovine serum albumin ("FITC-BSA"). FIGS. 1A to 1F illustrate the molecular structure of exemplary chemicals useful in the method of the present invention. Without wishing to be bound by any mechanism or theory, it is believed that non-polar imaging agents are primarily adsorbed on a region that is not exposed to ultraviolet light and therefore contains non-acidic functionalities after exposure, while polar imaging agents are primarily adsorbed on a region that is exposed to ultraviolet radiation and therefore contains acidic functionalities after exposure. For example, the relatively non-polar Bodipy-ester is believed to be primarily absorbed onto t-butyl ester groups of PtBA chains in regions that are shielded from irradiation by the opaque portions of the mask. In these shielded regions, the t-butyl ester groups are not converted to carboxylic acid groups.

The invention may be further described by the following the examples, which are not intended to limit the scope of the invention in any way.

EXAMPLES

A. Materials

Figure 1B:
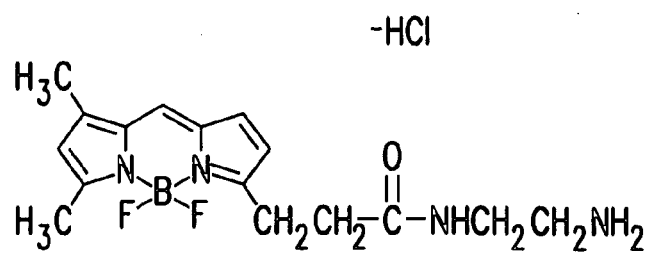
Figure 1C:
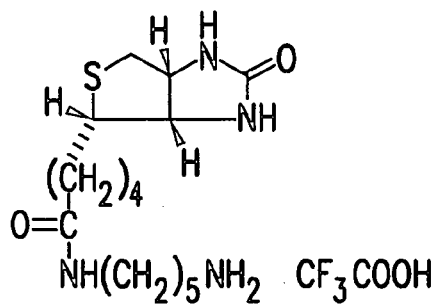
Figure 1D:
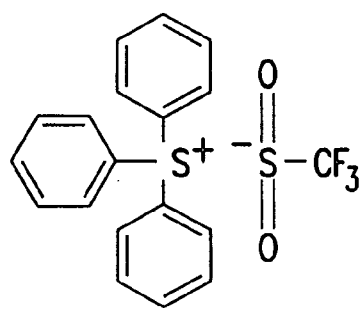
Figure 1E:
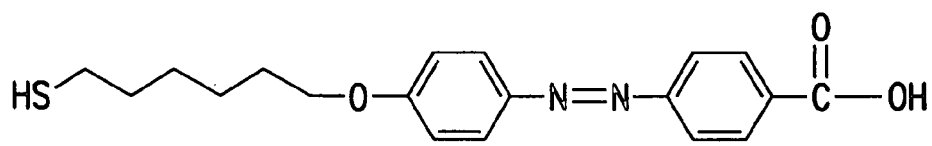
Figure 1F:
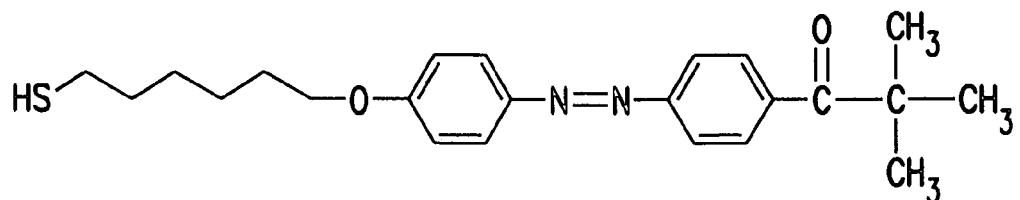
Figure 16:
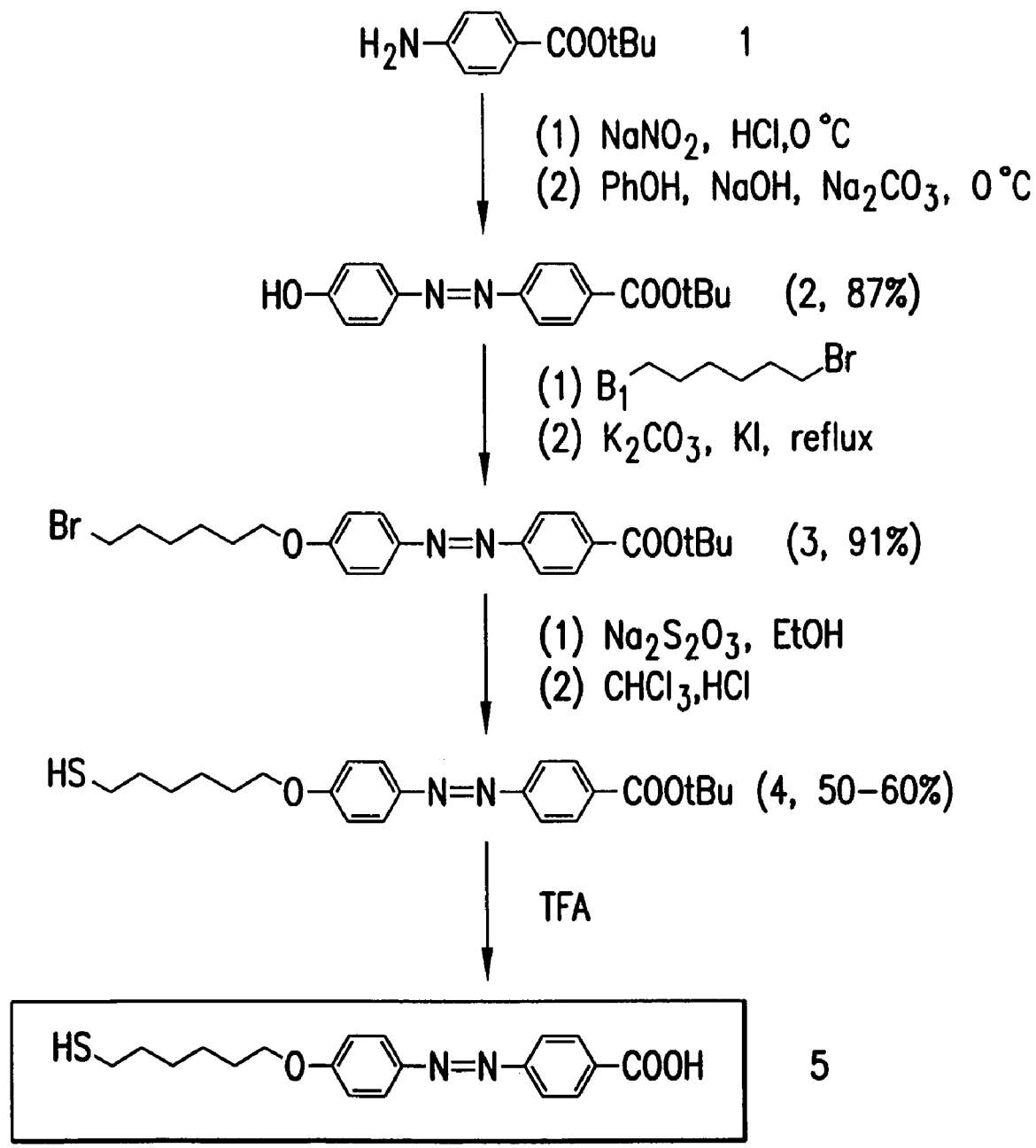
FIG. 16 shows the preparation of azo-COOH and azo-tBu.
Figure 17:
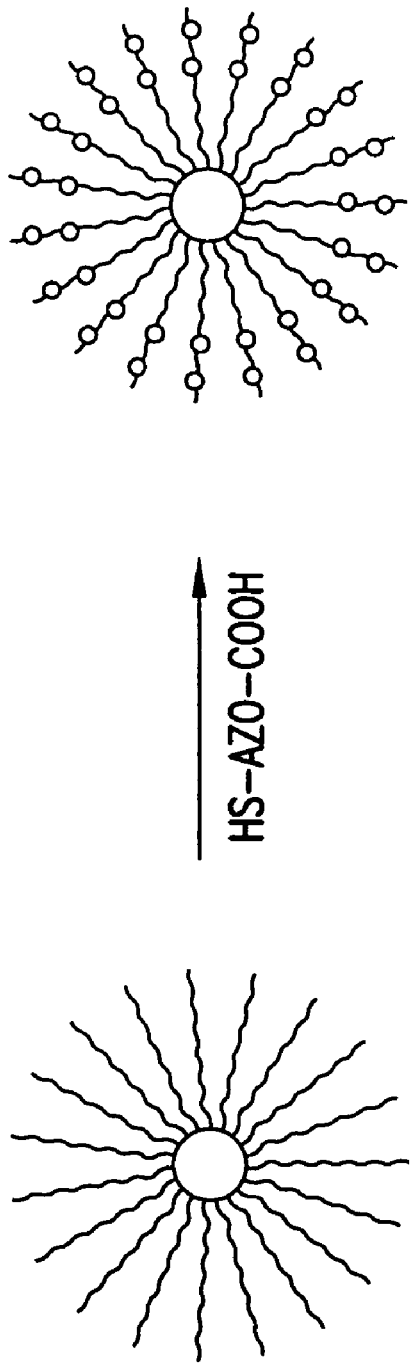
FIG. 17 shows the preparation of SAM-azo-COOH on a gold nanoparticle.

All materials and chemicals were used as received from the sources indicated below, unless stated otherwise. Carboxylic acid and t-butyl terminated azobenzene self-assembled monolayers, including SAM-azo-COOH and SAM-azo-tBu, were synthesized in our lab, by preparing the acid and ester according to the sequence shown in FIG. 16 to form the self-assembled monolayer as shown in FIG. 17 so as to obtain a self-assembled monolayer on a nanoparticle substrate having a gold surface. Polystyrene ("PS") (Molecular Weight=250K) was purchased from Acros Organics Inc. A PtBA-b-PS block copolymer in which the Molecular Weight of both the PtBA portion and the PS portion is 200K ("PtBa (200K)-b-PS(200K)") was purchased from Polymer Source Inc. co-triethoxy PS (Molecular Weight=200K) was purchased from Scientific Polymer Inc. Activating agents 1-ethyl-3-(3-dimethylaminopropyl)carbodiimide hydrochloride ("EDC") and N-hydroxysuccinimide ("NHS") were purchased from Aldrich. Triphenylsulfonium triflate was obtained as a gift from IBM. Solvents including toluene (99.5% purity) and Propylene glycol methyl ether acetate (PGMEA, 99% purity) were purchased from Aldrich. Ethanol (200 proof, absolute) was purchased from Pharmco Products. Inc. Most imaging agents were purchased from Molecular Probes Inc., including Bodipy-ester, Bodipy-NH$_2$), Biotin-NH$_2$, and Alexa488-Streptavidin. FITC-BSA was obtained as a gift from Professor Robert Prud'homme at Princeton University. FIGS. 1A to 1F illustrate the molecular structure of exemplary chemicals used in this study. FIG. 1A=Bodipy-ester; FIG. 1B=Bodipy-NH$_2$; FIG. 1C=Biotin-NH$_2$; FIG. 1D=triphenylsulfonium trifluorosulfonate; FIG. 1E=sam-azo-COOH; FIG. 1F=SAM-azo-t-butyl.

B. Experimental Section

1) Contact Angle Measurement.

Sessile drop water contact angle measurements were carried out at room temperature with a model 100-00 contact angle goniometer (Rame-Hart, Inc.). The contact angles were recorded immediately after depositing 1 µL water droplets with a pipette onto the molecular surfaces before and after patterning. The values of measurements of at least 4 different samples for at least 4 different spots for each sample were averaged to obtain a contact angle value. Contact angle titration was carried out by measuring contact angles of a 1 µL water droplet with the pH ranging from 2 to 13. The pH of the aqueous solution was adjusted by adding NaOH or HCl until the desired pH value was reached.

2) X-ray Photoelectron Spectroscopy (XPS).

XPS spectra were recorded with a PHI 5500 model Spectrometer equipped with an Al K$_\alpha$ monochromator X-ray source operated at 15 kV and 23.3 mA, a hemispherical electron energy detector, and a multichannel analyzer. The test chamber pressure was maintained below $2\times10^{-9}$ ton during the spectra acquisition. A low energy electron flood gun was used to internally neutralize possible surface charge. The XPS Binding energy (BE) was internally referenced to the main aliphatic C-1s peak (BE=284.6 eV). Survey spectra were acquired at an analyzer pass energy of 93.9 eV and BE resolution of 0.8 eV, while high resolution spectra were acquired with a pass energy of 23.5 eV and BE resolution 0.05 eV.

Angle dependent XPS (ADXPS) was performed by rotating the sample holder to the desired take-off angle by a motor, where the term "take-off angle" is defined as the angle between the normal to the sample surface and the detector. The spectrum curve was fitted by a Gaussian-Lorentz function after subtracting a striped background using a data processing software package which was provided by the manufacturer of the X-ray photoelectron spectrometer, under the constraint of setting reasonable BE shift and characteristic full width at high maximum (FWHM) range. Atomic concentration was calculated by normalization of the peak area to the elemental sensitivity factor data provided by a database provided by the manufacturer of the X-ray photoelectron spectrometer.

3) Fluorescence Microscope.

Figure 19A:
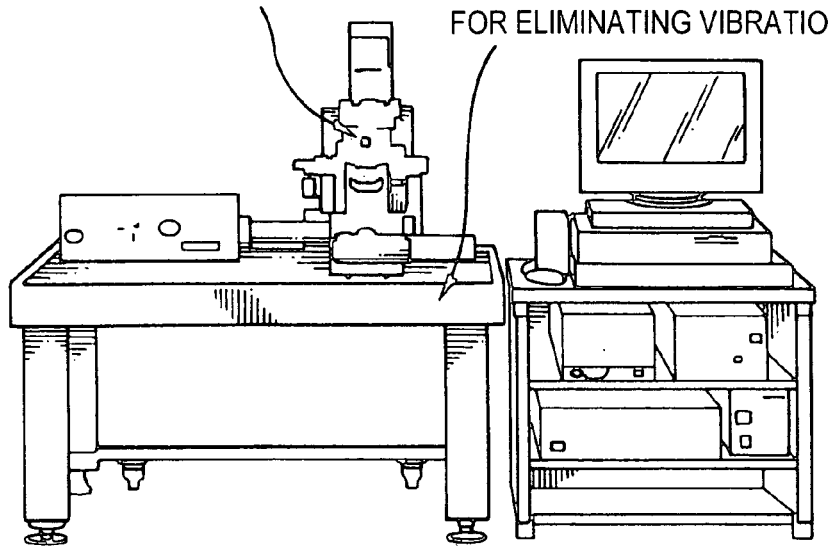
FIG. 19A shows the components of a laser scanning confocal microscope for fluorescence imaging of surfaces.
Figure 19A:
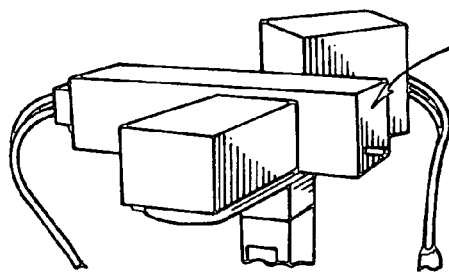
Figure 19A:
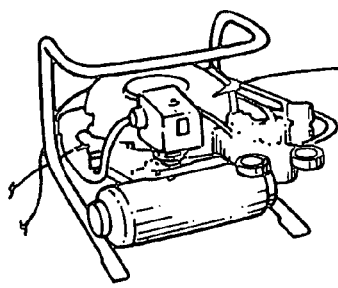
Figure 19B:
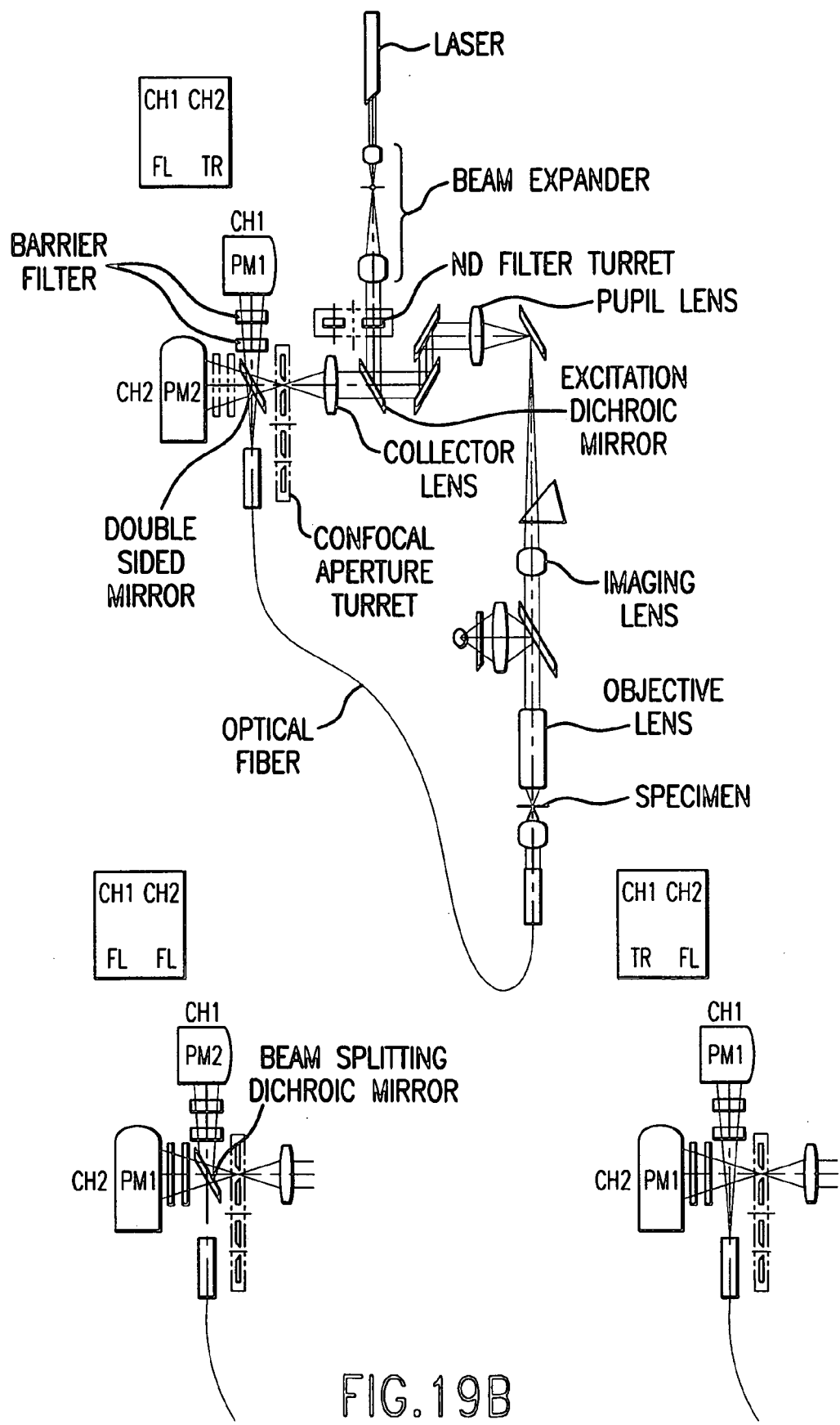
FIG. 19B illustrates an optical path diagram for a laser scanning confocal microscope for fluorescence imaging of surfaces.

Fluorescence imaging of surfaces was carried out using an Olympus IX70 laser scanning confocal microscope equipped with an Ar laser as the excitation source of 488 nm radiation. The components of the microscope, including the detector and compressor, are shown in FIG. 19A. The optical path diagram is illustrated in FIG. 19B. The emission intensity was collected above 510 nm after passing through a 510 nm long pass filter which collects fluorescence emission signals with a wavelength above 510 nm. The fluorescence intensity was monitored as a function of the X-Y position as the sample was focused above the laser beam through a 20× objective. A 10× objective may also be used. Fluorescence image (512×512 pixels) was typically acquired at a photomultiplier tube (PMT) voltage of 900V and a scan speed of 16 second per scan.

4) Reflection Mode Optical Microscope.

Light micrographs were recorded from Nikon OPTIPHOT metallurgical darkfield microscope equipped with a Kodak MDS digital camera in the reflection mode. Images were acquired using a 20× and a 5× objective.

5) Water Condensation Imaging:

Ordered array of water droplets were condensed at the hydrophilic surface —COOH sites, either from the moisture obtained by rapidly breathing onto the cold sample surface, or by placing the sample with the patterned surface upside down above a few drops of deionized ("DI") water which are slightly heated at 50° C. to help evaporate the water, which condenses into droplets on the cold sample surface.

6) Surface-Patterned Polymer Brush Formation and Pattern Imaging.

A) Formation of a Polymer Brush:

The polymer brush was prepared as follows. Glass slides were cleaned by etching with a NaOH/$H_2$O/Ethanol mixture (1:1:8 w/w) for 10 minutes, rendering the surface hydrophilic (water contact angle <5°). Polystyrene ("PS") (MW=250K) was then spin coated at 2000 rpm for 1 minute after deposition of a solution of 0.77% by weight of PS in toluene onto the cleaned glass substrate to form a coating of PS on the glass substrate ("PS/Glass"). Drops having a size of about 0.05 ml for a 2 cm×2 cm substrate surface were deposited from a solution having a concentration of 0.5%-1% by weight. A coating of PtBA(200K)-b-PS(200K) block copolymer was then spin coated onto the PS coating on the glass substrate (2000 rpm, 1 minute) after deposition of a solution of 0.46% w/w polymer in toluene on top of the PS/Glass to form a polymer brush hereinafter referred to as "PtBA-b-PS/PS/Glass."

B) Photopatterning of the Polymer Brush:

The PAG triphenylsulfonium triflate was spin coated (1000 rpm, 1 minute) on top of the PtBA-b-PS/PS/Glass after deposition of a solution of the PAG in ethanol (1.5% w/w) to form a coating of the triflate on the PtBA-b-PS/PS/Glass, hereinafter referred to as "PAG/PtBA-b-PS/PS/Glass." props having a size of about 0.05 ml for a 2 cm×2 cm substrate surface were deposited from a solution having a concentration of 0.5%-1% by weight. The PAG/PtBA-b-PS/PS/Glass was placed under a hand held UV lamp and exposed to UV light (254 nm, 760 µw/cm$^2$) for 5 minutes with a contact mask on the PAG coating. The UV-exposed sample was postbaked at 100° C. from 30 seconds to a few minutes to facilitate the diffusion of photogenerated acid molecules and increase the t-butyl group deprotection rate. The excessive PAG was washed away by ethanol and dried under a $N_2$ stream.

C) Fluorescence Imaging of the Surface-Patterned Polymer Brush:

A polymer brush sample having a surface prepared and patterned as described in B) above was fluorescence imaged after being immersed in the sample overnight in a 10 µM ethanolic solution of Bodipy-NH$_2$ or Bodipy-Ester, taking the sample out of the solution, and then drying the sample under a $N_2$ stream.

D) Biomolecules Surface Immobilization on a Surface-Patterned Polymer Brush:

i) Immobilization of FITC-BSA:

Immobilization of FITC-BSA was achieved by immersing a sample having a surface prepared and patterned as described in B) into an ethanol solution of FITC-BSA (10 µM) overnight, after which the sample was removed from the solution and dried under a $N_2$ stream.

ii) Immobilization of Biotin/Strepavidin-Alex488

A sample having a pattern of carboxylic acid groups prepared as described in B) was immersed into a deionized ("DI") water (Resistance=18.2 MΩ) solution of EDC (0.1M) and NHS (0.2M) for an hour to activate the surface COOH groups. The sample was then immersed into an ethanol solution of Biotin-NH$_2$ (10 mM) for an hour to convert the activated surface COOH groups to CO—NH-Biotin groups, thereby binding the Biotin moieties to the sample surface in a pattern defined by the mask. The resulting sample was washed with DI water and ethanol. The sample was immersed into a solution of 10 µM Alexa488-streptavidin in HEPES buffer (pH=7.4), also containing 0.1% (w/w) BSA and 0.02% (v/v) Tween 20 detergent for 4 hours, after which the sample was taken out of the solution, washed with HEPES buffer, and dried under a $N_2$ stream to form a complex of Alexa488 labeled streptavidin on the surface of the sample.

7) Surface Patterned Azobenzene Sam Formation and Pattern Imaging.

A) SAM Substrate Preparation

A gold surface was prepared by evaporation in an Edwards Auto 306 thermal evaporator of 100 nm of gold under high vacuum (P<$10^{-6}$ torr) onto polished Si single-crystal wafers or glass slides primed with a 10 nm Cr or Ti layer to improve the adhesion of the gold films. SAMs were then formed on the gold surface by immersing the freshly evaporated gold samples in 1 mM solutions of SAM-azo-tBu in ethanol or THF overnight in a cleanroom (Class 100). The SAM samples were stored before use.

B) Photopatterning of SAM Substrate.

A coating containing PS and the PAG triphenylsulfonium triflate (7.9% wt./wt. PAG relative to PS) was spin coated (2500 rpm, 2 minutes) after deposition of from a solution of PS and the PAG in PGMEA (7.2% w/w) onto the SAM-azo-tBu formed on the gold surface deposited on the substrate ("SAM-azo-tBu/Au") to form a coating containing PS and PAG at least about 1 µm thick, hereinafter referred to as "PS(PAG)/SAM-azo-tBu/Au." props having a size of about 0.05 ml for a 2 cm×2 cm substrate surface were deposited from a solution having a concentration of 0.5%4% by weight. The PS(PAG)/SAM-azo-tBu/Au coating was placed under a hand-held UV lamp and exposed to UV light (254 nm, 760 µw/cm$^2$) through a contact mask having a desired pattern of opaque and transparent regions for 10-30 seconds in the presence of a photomask contacting the top of the sample. The UV-exposed sample was postbaked at 100° C. from 30 seconds to 1 minute to facilitate diffusion of the photogenerated acid molecules and increase the t-butyl group deprotection rate in the UV irradiated regions. The coating containing PS and an excess of PAG was washed away by immersing the sample into toluene for 30 minutes, after which the sample was removed from the toluene, and then dried under a $N_2$ stream.

8) Characterization of Polymer Brush Surface.

Figure 4A:
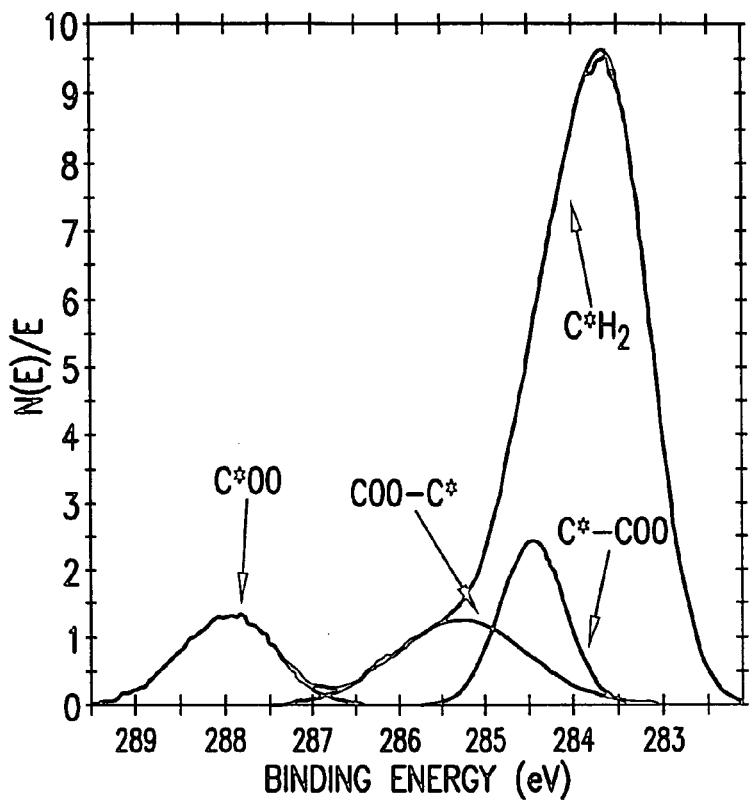
FIG. 4A shows high resolution C-1s peaks in the XPS spectra of polymer brushes of PtBA-b-PS.
Figure 4B:
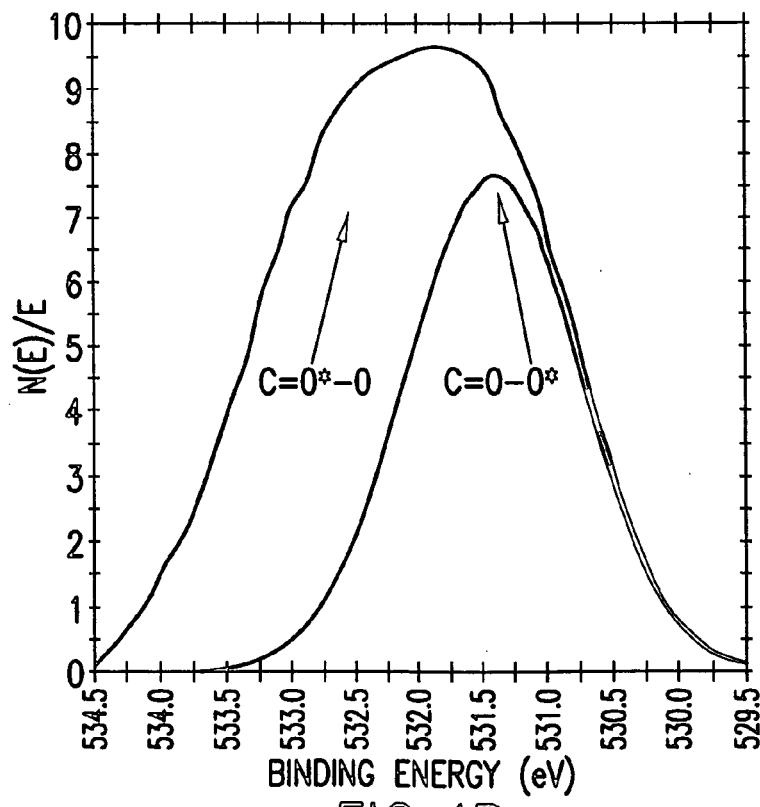
FIG. 4B shows high resolution O-1s peaks in the XPS spectra of polymer brushes of PtBA-b-PS.

In PtBA-b-PS, PtBA is the surface active block due to a low surface tension compared to PS. A symmetric PtBA(200K)-b—PtBA(200K) block copolymer was used to favor lamella formation. Polymer brush patterning was accomplished using the procedure shown in FIG. 2A. Angle-dependent XPS (ADXPS) was used to confirm the surface segregation of surface active PtBA polymeric blocks and to estimate the thickness of the domain formed by the top PtBA sequences of the block copolymers. XPS Survey spectra of the PtBA-b-PS/PS brush samples prepared according to the procedure of FIG. 2A show only C and O peaks as expected, as shown in FIGS. 4A and 4B. The elemental composition of C and O is listed in Table 1 at five different take-off angles. Since the O signal should only come from PtBA, the surface molar composition of PtBA and PS within the XPS sampling depth may be calculated from the O/C ratio according to equation (1):

$$O/C = 2*\phi_1(PtBA)/(9*\phi_1(PtBA)+8*(1-\phi_1(PtBA)), \quad (1)$$

where $\phi_1(PtBA)$ is the surface mole fraction of PtBA calculated from O/C.

FIG. 4A shows high-resolution XPS C-1s spectra with deconvoluted C subpeaks corresponding to C with different chemical environments. The peak centered around 288 eV in the figure (BE shift=4.0~4.2 eV) is due to the carbonyl C(C*OO—). The peak centered around 286.3 eV (BE shift=1.6~1.8 eV) is due to the ester C(COO—C*). The peak centered around 285.4 eV (BE shift=0.7~0.8 eV) is due to the C a to the carbonyl group (C*—COO). The peak positions and BE shifts are all in very good agreement with the measured C-1s peak positions of spin-coated pure PtBA film. The composition ratios for the three different types of carbon described above are given in Table 1. Most composition ratios are very close to a 1:1:1 value as is expected from the molecular structure of PtBA. The surface molar composition of PtBA can also be calculated from each type of BE shifted C(C*OO, C*—COO, COO—C*) composition of the total C component. To reduce the uncertainty brought by curve fitting, the surface molar composition of PtBA was obtained from the average C composition value of 3 types of BE shifted C, according to Equation (2):

$$C(\text{avg. of BE shifted C})/C\_total = \phi_2(PtBA)/(7*\phi_2(PtBA)+8*(1-\phi_2(PtBA)), \quad (2)$$

where $\phi_2(PtBA)$ is the surface molar composition of PtBA calculated from C(avg.)/C_total.

Figure 5A:
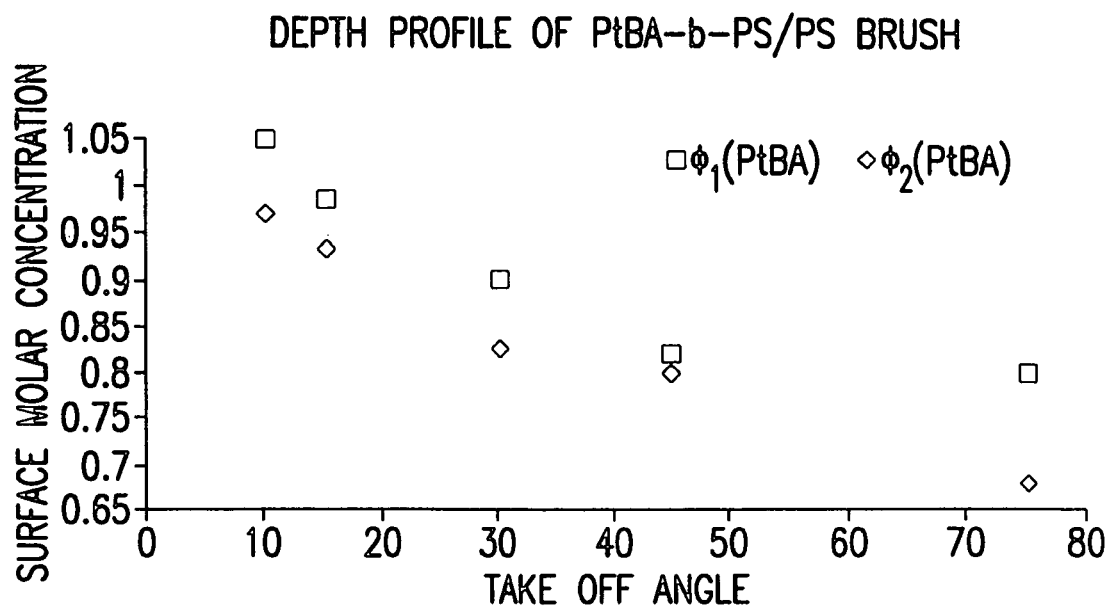
FIG. 5A shows plots of PtBA concentration as a function of the take-off angle.

$\phi_1(PtBA)$ and $\phi_2(PtBA)$ values are compared in FIG. 5A. $\phi_1(PtBA)$ is consistently larger than $\phi_2(PtBA)$ by 2~12% at all take-off angles. This may due to the presence of surface contaminants which generally have more O content than PtBA and may therefore cause the calculated value of $\phi_1(PtBA)$ to be larger than the actual value. Both $\phi_1(PtBA)$ and $\phi_1(PtBA)$ show angle/depth dependent profiles (FIG. 5A) which are indicative of the surface segregation of surface active PtBA block. High-resolution O-1s spectra (FIG. 4B) show a split into two subpeaks with a peak area ratio of about 1:1. The peak centered at 532.7 eV in the figure arises from the carbonyl O(C=O*—O) while the peak centered at 531.9 eV corresponds to the ester O(C=O—O*).

TABLE 1

ADXPS elemental composition of C and O and elemental composition of various C components.*

| Take-off Angle | C | O | C*OO | COO—C* | C*—COO | C*(avg) | θ1 (PtBA) | θ2 PtBA |
|---|---|---|---|---|---|---|---|---|
| 10° | 76.85 | 23.15 | 12.93 | 12.07 | 16.38 | 13.79 | 1.047 | 0.970 |
| 15° | 78.09 | 21.91 | 11.35 | 12.28 | 15.9 | 13.18 | 0.984 | 0.931 |
| 30° | 79.79 | 20.21 | 11.62 | 12.38 | 10.37 | 11.46 | 0.899 | 0.822 |
| 45° | 81.50 | 18.50 | 9.62 | 11.03 | 12.54 | 11.06 | 0.815 | 0.797 |
| 75° | 81.87 | 18.13 | 7.92 | 8.96 | 10.89 | 9.26 | 0.797 | 0.678 |

*All numbers in the table are percentages (%). Percentages of C*OO, COO—C* and C*—COO are calculated on the basis of the area of the respective C-1s XPS bands (BE(C*OO) = 288.8 eV, BE(COO—C*) = 286.4 eV and BE(C*—COO) = 285.4 eV).
C*(avg.) is the average value of the percentage of C*OO, COO—C* and C*—COO.
θ1(PtBA) is the surface molar composition of the PtBA component calculated from the C and O elemental composition.
θ2(PtBA) is the surface molar composition of the PtBA component calculated from the value of C*(avg.).

ADXPS was used to quantitatively estimate the thickness of the domain formed by the top PtBA sequences of the block copolymers assuming a bilayer model of polymer brush system in which a layer of PtBA of finite thickness d lies on top of a coating of PS of a thickness which is much greater than the XPS maximum sampling depth (~10 nm) due to a "layering effect," which is caused by microphase separation of incompatible blocks in the PtBA-b-PS block copolymer. The value of the PtBA thickness d can be derived from equation (3):

$$\frac{I(C^* = O - O)}{I(C\_total)} = \quad (3)$$

Figure 5B:
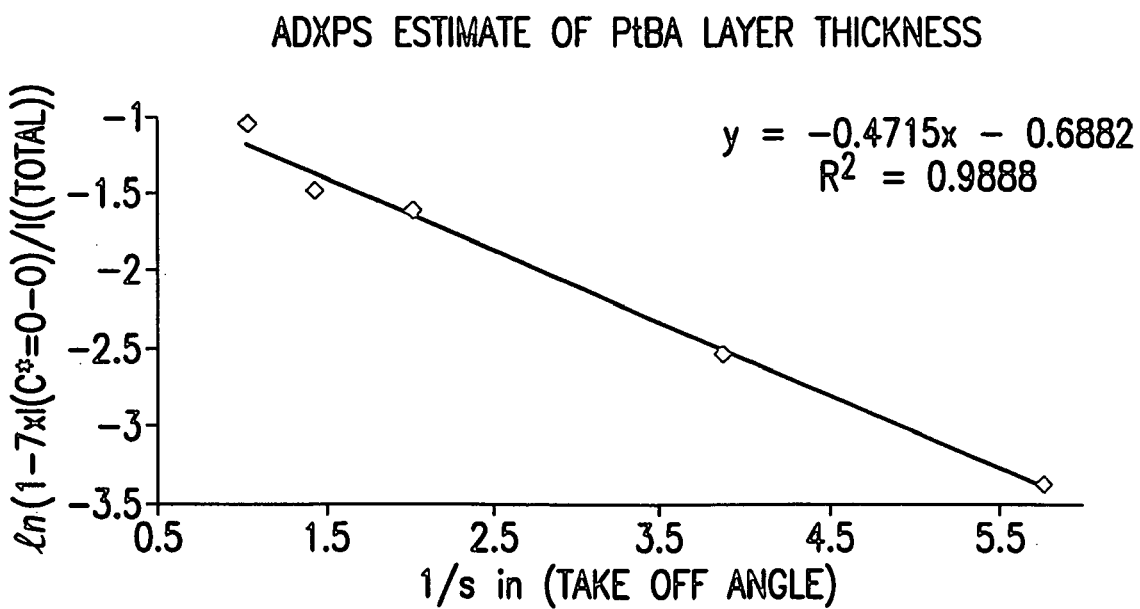
FIG. 5B shows a plot of $\ln(1-7 \times I(C^*=O-O)/I(C\_total))$ vs. $1/\sin \theta$, where $I(C^*=O-O)$ and $I(C\_total)$ represent the amounts of ester carbonyl carbon of all carbons, respectively.

-continued $$\frac{k \times \frac{1}{7} \times \int_0^d \exp\left(\frac{-x}{\lambda \sin\theta}\right) dx}{k \times \int_0^d \exp\left(\frac{-x}{\lambda \sin\theta}\right) dx + k \times \int_d^\infty \exp\left(\frac{-x}{\lambda \sin\theta}\right) dx} = \frac{1}{7} \times \left(1 - \exp\left(\frac{-d}{\lambda \sin\theta}\right)\right)$$

where $I = k \ast \int N \ast \exp(-x/(\lambda \sin \theta)) dx^{36}$, and
where k is an instrument constant, $\lambda$ is the photoelectron mean free path or attenuation length defined as the distance normal to the surface at which the probability of an electron escaping without significant energy loss due to inelastic scattering processes is 1/e of the original value of the probability of formation, $\theta$ is the take-off angle, and N is the elemental number density The slope of the line obtained by plotting $\ln(1-7 \times I$ ($C^* = O\text{---}O)/I(C\_total))$ vs. $1/\sin \theta$ is $d/\lambda$, from which the thickness d of the domain formed by the top PtBA sequences of the block copolymers for a known value of $\lambda$ can be obtained. Such a plot is shown in FIG. 5B. The ADXPS estimated thickness d is $\lambda\ast 0.47 = 3.55\ast 0.47 = 1.67$ nm. The value of 3.55 nm for $\lambda$ is reported, for example, in C. D. Bain and G. M. Whitesides G. M., *J. Phys. Chem.*, Vol. 93 (1989), p. 1670.

Figure 6:
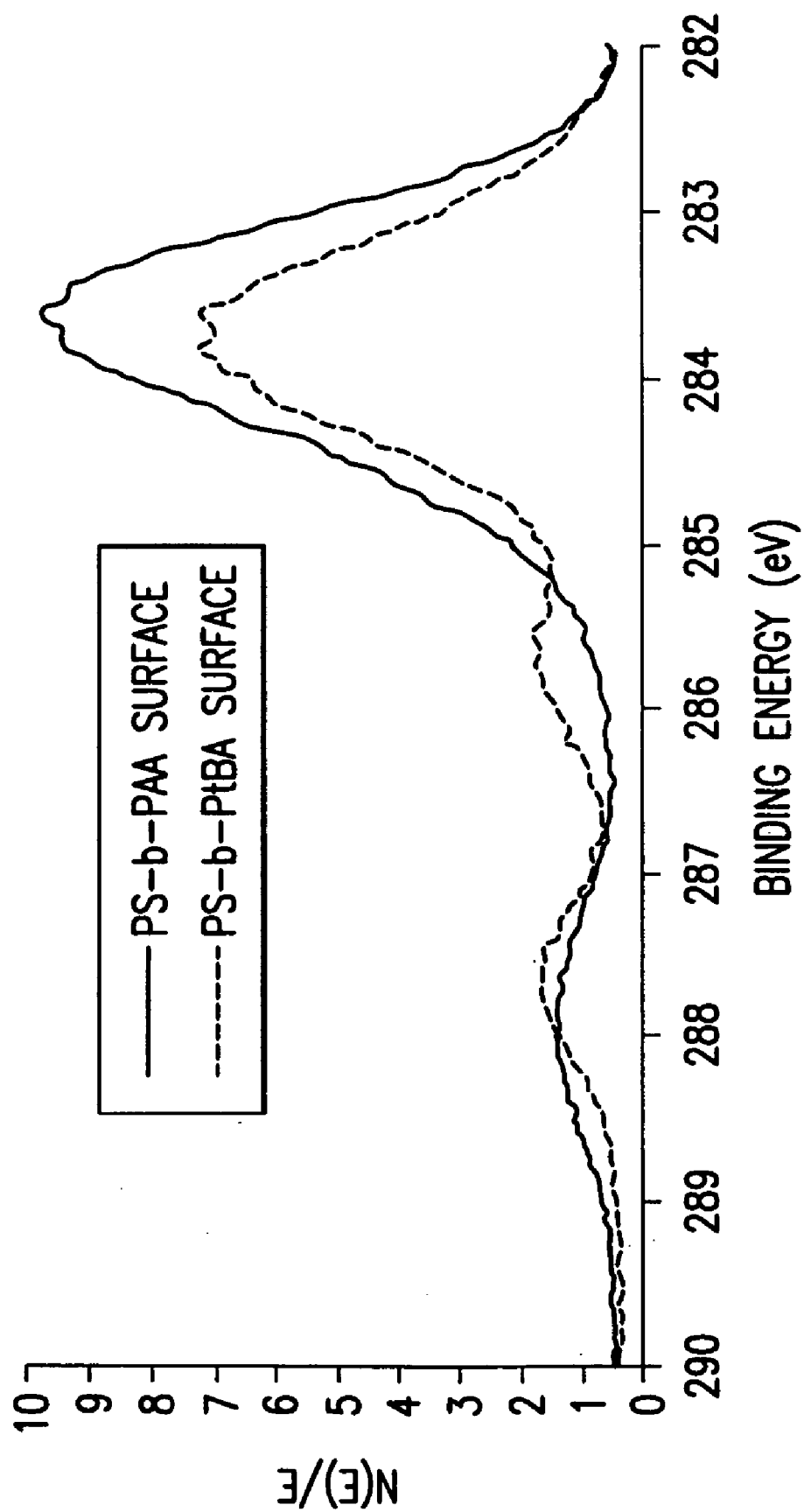
FIG. 6 shows XPS C-1s spectra of the surface coating before and after removal of the t-butyl groups of PtBA.

After the photogenerated acid deprotects the t-butyl ester group of PtBA, the originally hydrophobic surface (($\theta s = 90°$ C.) becomes hydrophilic (($\theta s = 35°$ C.) due to the formation of —COOH groups on the surface. The polymer surface after the deprotection step no longer appears smooth under an optical microscope. This is probably due to the volume shrinkage of the polymer brushes after the PtBA chains are converted to PAA chains. The XPS C-1s spectra shown in FIG. 6 also lacks the ester C peak ((COO—$C^*$, BE~286.6 eV), confirming that the t-butyl groups of PtBA have been removed.

9) Imaging of Patterned Polymer Brush Surface.

Figure 7A:
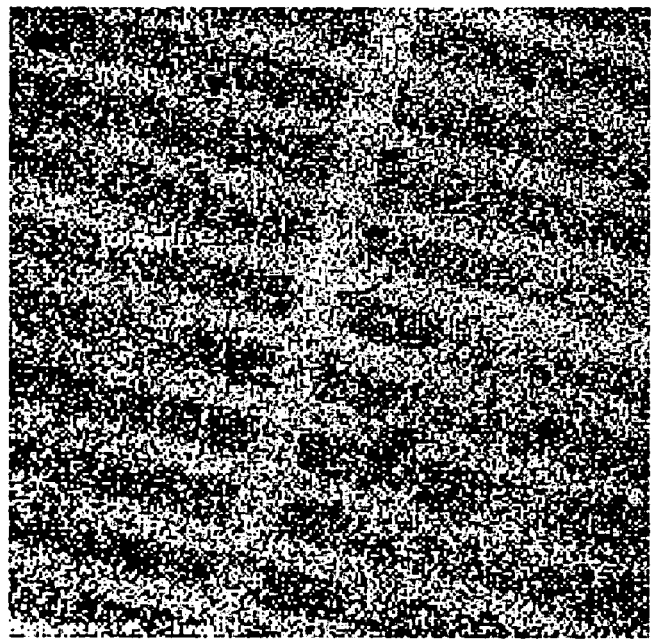
FIG. 7A shows the pattern of 4,4-difluoro-1,3,5,7-tetramethyl-4-bora-3a, 4a-diaza-s-indacene-8-propionic acid, succinimidyl ester (BODIPY® 493/503, SE, "Bodipy-ester") adsorption to photomask-protected PtBA regions.
Figure 8:
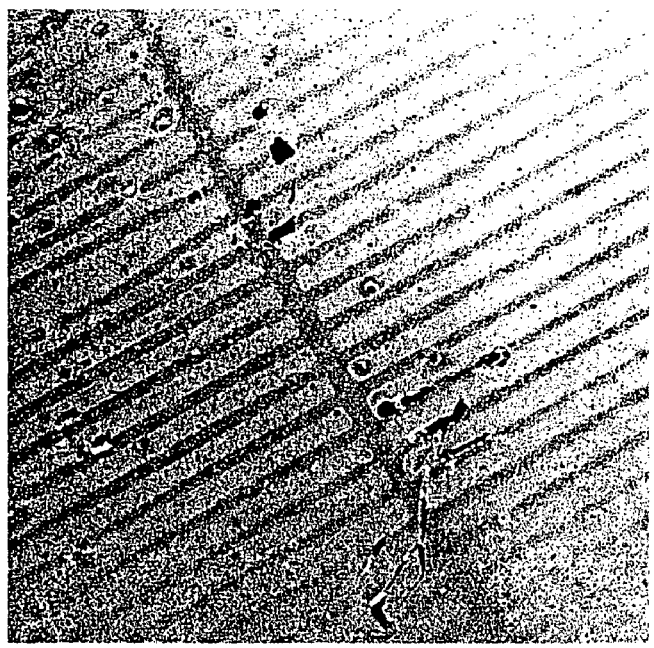
FIG. 8 shows the pattern of 4,4-difluoro-5,7-dimethyl-4-bora-3a,4a-diaza-s-indacene-3-propionyl ethylenediamine hydrochloride (BODIPY® FL EDA, "Bodipy-$NH_2$") adsorption to photomask-unprotected PtBA regions.
Figure 7B:
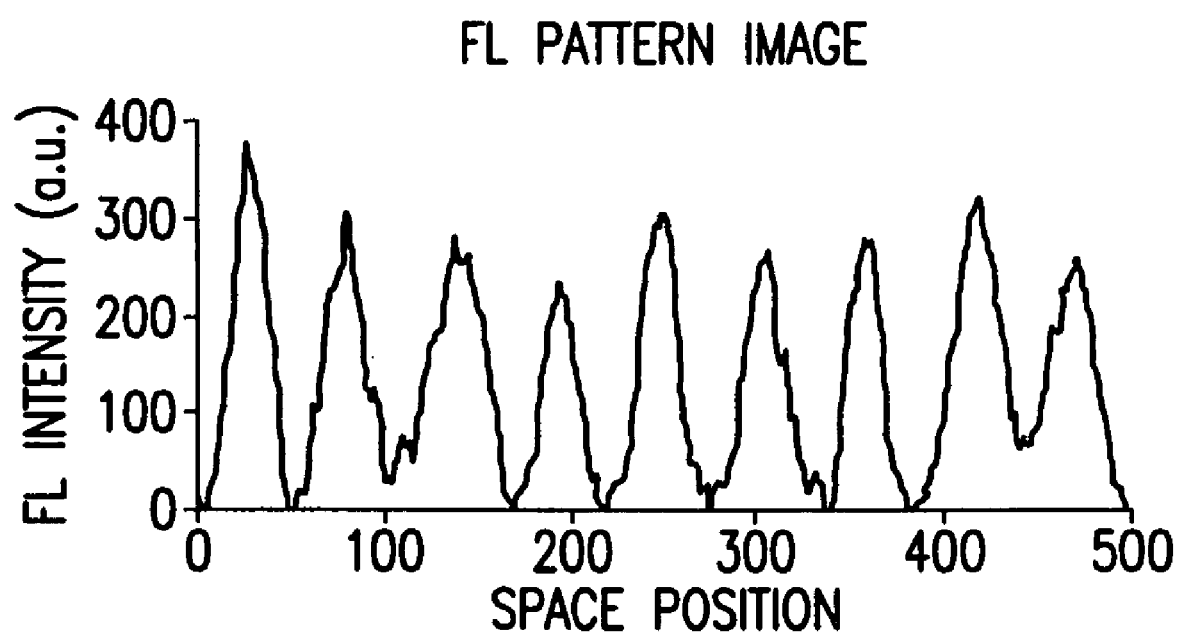
Figure 9A:
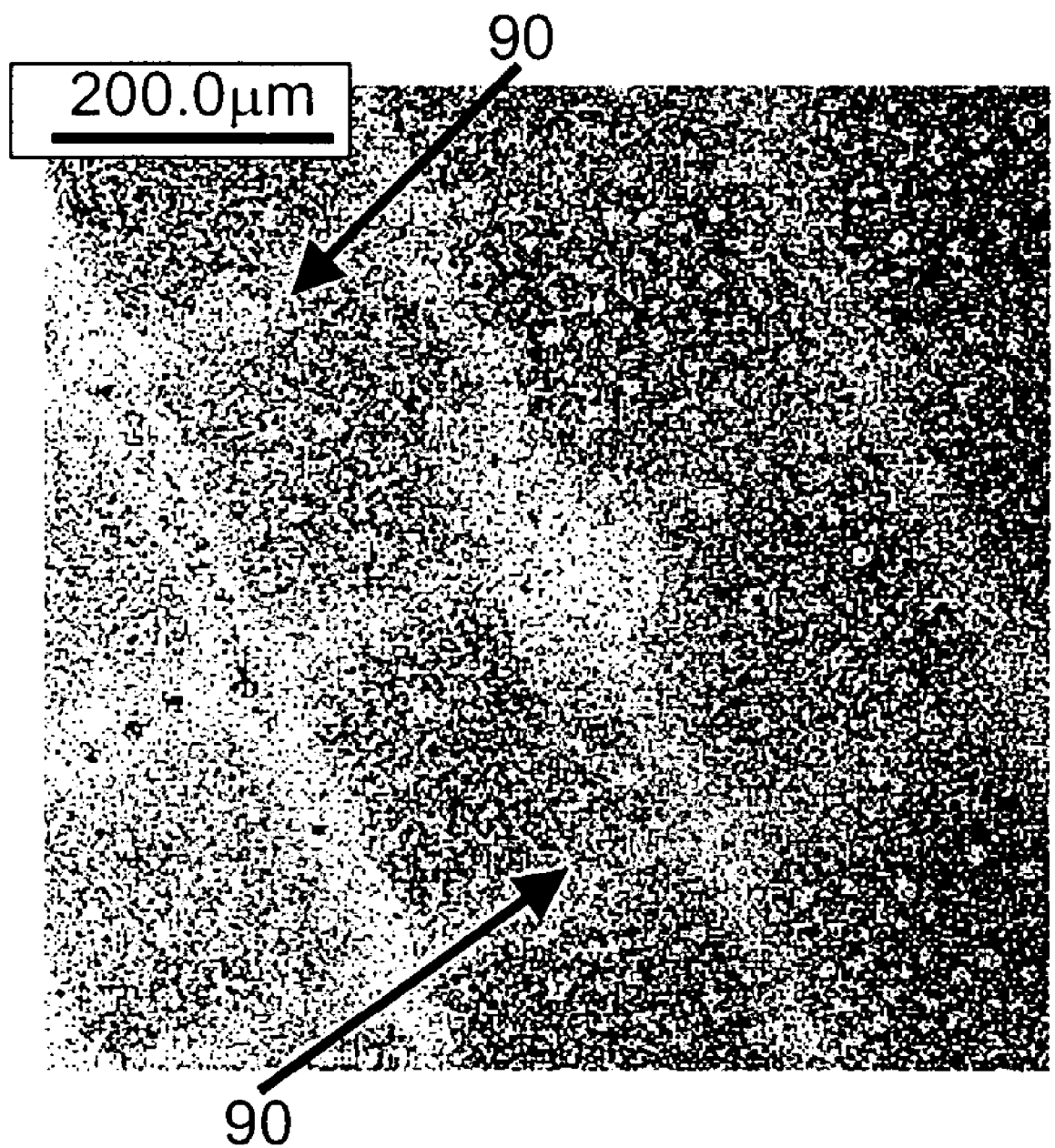
FIG. 9A shows the pattern of FITC-BSA adsorption to photomask-protected PtBA regions.
Figure 9B:
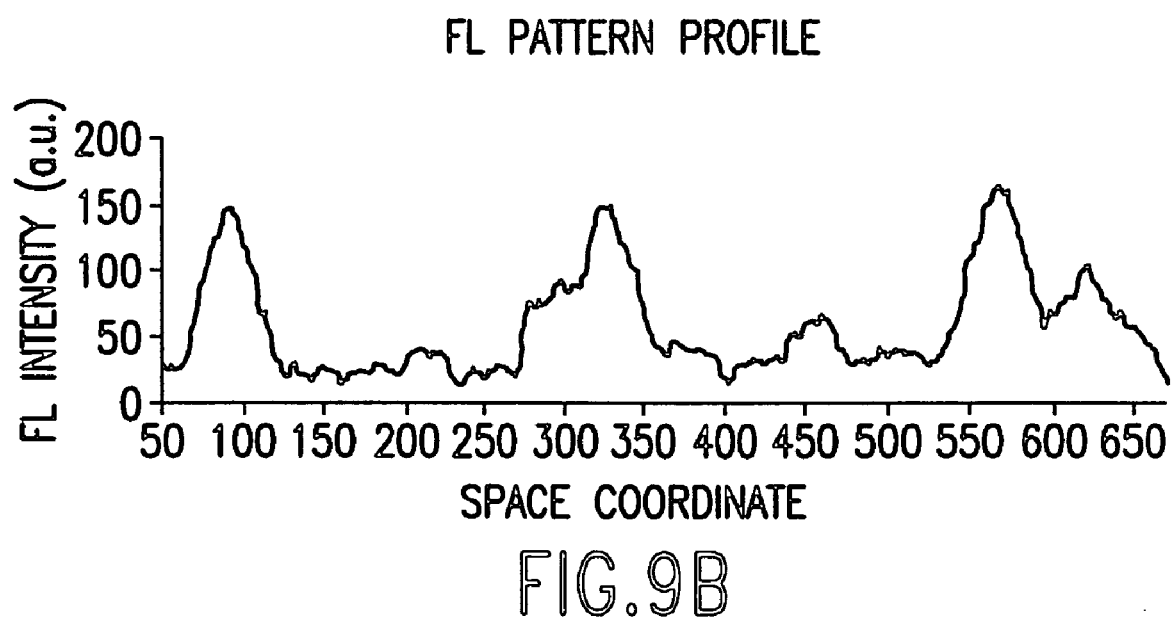
FIG. 9B shows the fluorescence intensity line profile of line 90 of FIG. 9A.

FIG. 7A is an optical micrograph showing Bodipy-ester adsorption to PtBA regions shielded from irradiation by opaque parallel stripes of a mask, where the opaque stripes are separated from one another by 100 µM wide parallel transparent stripes. This adsorption pattern is believed to be due to the hydrophobic interactions between the relatively non-polar groups of Bodipy-ester and the PtBA ester groups. FIG. 7B shows the fluorescence intensity profile measured along line 70 in FIG. 7A. The fluorescence intensity spatial periodicity in FIG. 7B is 100 µm, which corresponds to the spacing of the opaque stripes in the mask. FIG. 8 is an optical micrograph showing the photo-patterned polymer brush surface treated with Bodipy-$NH_2$. This dye adsorbs to the UV-exposed PAA regions. This adsorption pattern is believed to be due to an electrostatic attraction between an $NH_3^+$ group on the dye and a —COO$^-$ group on the surface, where the $NH_3^+$/COO$^-$ pair is formed after one proton from the surface —COOH group is transferred to the terminal $NH_2$ group in Bodipy-$NH_2$. FIG. 9A shows the pattern of FITC-BSA adsorption to PtBA regions shielded from irradiation by a regular array of opaque squares separated from one another by a 250 µm wide transparent stripe on each side of each square. FIG. 9B shows the fluorescence intensity profile measured along line 90 in FIG. 9A. The fluorescence intensity spatial periodicity in FIG. 9B is 250 µm, which corresponds to the spacing of the opaque stripes in the photomask.

10) Characterization of Immobilized Biomolecules on Polymer Brush Surface.

Figure 11A:
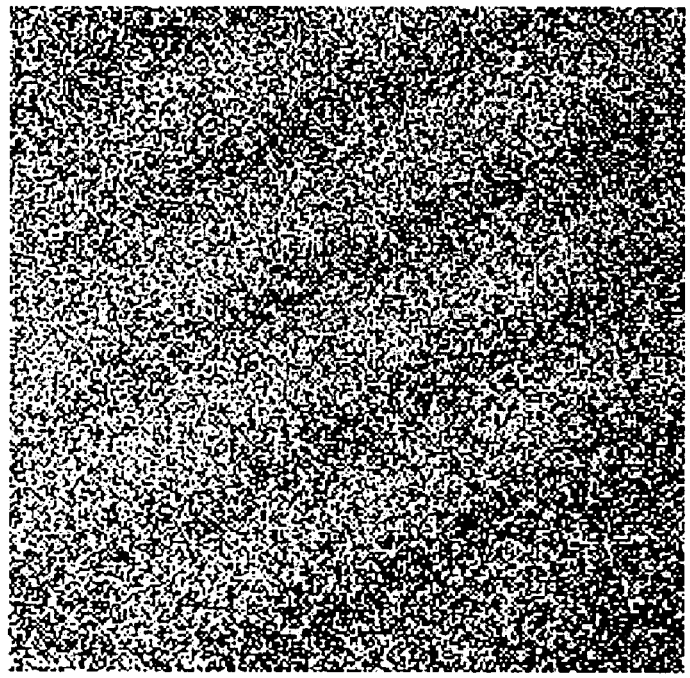
FIG. 11A shows a fluorescent image of the pattern of Alexa488-Streptavidin immobilized on Biotin-$NH_2$ bound to surface —COOH groups using a patterned mask having a series of parallel opaque stripes separated from one another by 100 µm-wide parallel transparent stripes for photopatterning.
Figure 11B:
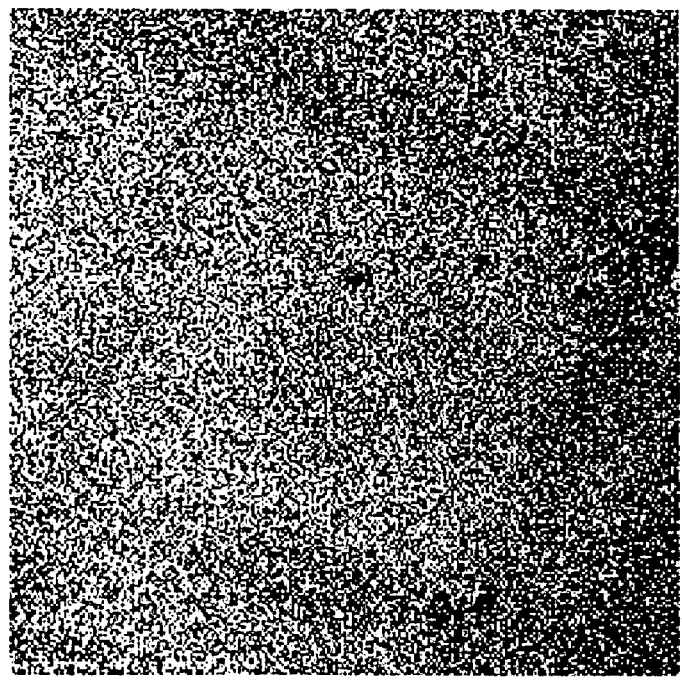
FIG. 11B shows a fluorescent image of the pattern of Alexa488-Streptavidin immobilized on Biotin-$NH_2$ bound to surface —COOH groups using a patterned mask having a regular array of squares separated from one another by a 250 µm wide transparent stripe on each side of each square for photopatterning.
Figure 12:
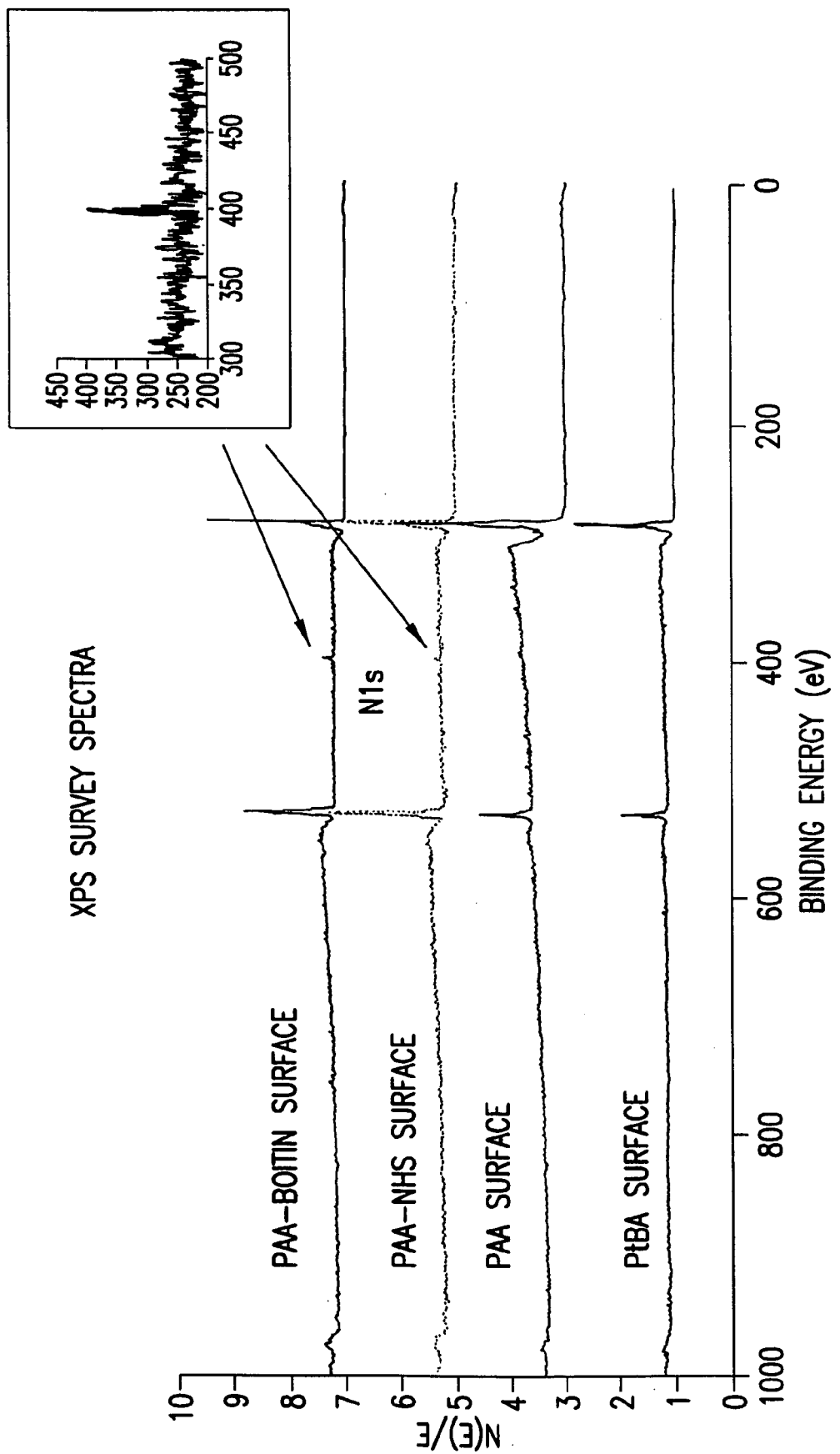
FIG. 12 shows XPS spectra in the 0-1000 eV range of the surface at each step in the conversion from PtBA to PAA bound to Biotin. The inset shows a magnified XPS peak in the N-1s region (BE ~400 eV).

Each step in FIG. 10 was monitored by XPS (FIG. 12) and contact angle measurements (Table 2). The elemental composition calculated from XPS data and the reaction yield calculated from the N/C ratio are also summarized in Table 2. The reaction yield was calculated for each stage of derivatization by comparison of the experimental N/C ratio to the theoretical N/C ratio assuming 100% conversion of the —COOH groups, shown in FIG. 10. Activation of COOH sites of PAA by NHS-EDC (FIG. 10) introduces a nitrogen peak at about 402.2 eV in XPS survey spectra due to the NHS nitrogen. A nitrogen peak is also present after coupling formation of PAA-Biotin, but the N-1s peak position is shifted to about 401.1 eV. The contact angle change (Table 2) in the derivatized polymer surface may also be used to monitor each step of the reaction sequence of FIG. 10. The theoretical N/C ratio following the EDC/NHS activation step was calculated from the atomic compositions to be 0.143 for a 100% reaction yield. The experimental N/C ratio obtained from an XPS multiplex scan taken at a take-off angle of 45° was 0.035, indicating a reaction yield for this step of 0.035/0.143, or 24.5%. The theoretical N/C ratio following the amidation reaction to bond PAA and Biotin was calculated to be 0.222 from the atomic compositions for a 100% reaction yield. Since only ~24.5% of PAA groups are EDC/NHS-activated and available for forming a bond with Biotin, the theoretical maximum N/C ratio was calculated to be 0.222×24.5%=0.054, which was very similar to experimental N/C ratio of 0.063 after the amidation reaction, suggesting that the amidation reaction proceeds in very high yield. An N/C value greater than 0.054 may be due to physisorption of additional Biotin-$NH_2$ to the inactivated surface —COOH groups of PAA through electrostatic attraction or hydrogen bonding. The sample containing the bound biotin functional groups was immersed into a solution of 10 µM Alexa488-streptavidin in HEPES buffer (pH=7.4), also containing 0.1% (w/w) BSA and 0.02% (v/v) Tween 20 detergent for 4 hours, after which the sample was taken out of the solution, washed with HEPES buffer, and dried under a $N_2$ stream to form a complex of streptavidin with the sample. FIGS. 11A and 11B show fluorescent images of the pattern of Biotin-$NH_2$/Alexa488-Streptavidin binding obtained by surface photopatterning using a mask having parallel opaque stripes separated from one another by 100 µm-wide transparent stripes and using a mask having a regular array of opaque squares separated from one another by a 250 µm wide transparent stripe on each side of each square.

TABLE 2

XPS and Water contact angle measurement values for derivatized polymer surfaces.

| Surfaces | C %[1] | O % | N % | N/C | Yield | Sessile drop water contact angle θs (°)[2,3] |
|---|---|---|---|---|---|---|
| PtBA | 81.50 | 18.50 | 0 | 0 | N/A | 90 |
| PAA | 74.04 | 25.96 | 0 | 0 | N/A | 35 conversion; 15 would be pure |
| PAA-NHS | 69.76 | 27.80 | 2.44 | 0.035 | 24.5% | 42 |
| PAA-Biotin | 67.22 | 28.54 | 4.25 | 0.063 | ~100% | 57 |

[1] All elemental compositions are obtained from XPS multiplex high resolution scan at a take-off angle of 45°.
[2] Sessile drop water contact angles of several additional reference surfaces were measured from spin coated thin film. The values are: θs(PS) = 85°, θs(PtBMA) = 90°, θs(PAA) = 15°.
[3] Contact angle values are obtained from several measurements. The uncertainty of each contact angle value is ±2°.

11) Characterization of Azobenzene SAMs.

Table 3 summarizes the water contact angle measurement values on azobenzene SAMs. The sessile drop water contact angle of SAM-azo-tBu is 92°, typical of a hydrophobic surface, while the sessile drop water contact angle of SAM-azo-COOH is 34°, typical of a hydrophilic surface. Deprotection of SAM-azo-tBu by cleavage with an acid formed from the PAG triphenylsulfonium triflate results in a change of water contact angle from 92° to 32°, very similar to the contact angle of SAM-azo-COOH surfaces. A control experiment was run in which PS was spin coated on SAM-azo-tBu in the absence of a PAG, exposed to UV and postbaked. The contact angle did not change in this experiment, indicating that the hydrophobic t-Bu groups of SAM-azo-tBu were not removed. Two other experiments were performed to confirm the acid nature of the hydrophilic surface after deprotection. 1) Contact angle titration showed a typical pH variation for the deprotected surface. The break-point of the pH titration curve was estimated as pH=10.2. A SAM-azo-tBu sample and a sample after deprotection were soaked in a 1M NaOH solution in water overnight. XPS showed that the deprotected sample adsorbs more than 10 times the amount of NaOH than the SAM-azo-tBu sample, confirming the presence of —COOH groups.

Table 3 also shows the elemental composition of C, N, O and S in azobenzene SAMs. The elemental composition of C and O is in good agreement with known elemental atomic composition of the azobenzene SAM except for a higher than expected value for the O elemental composition in SAM-azo-tBu, which may be ascribed to small contaminants with high oxygen content, such as $H_2O$ and $CO_2$. The elemental composition of N and S is lower than the theoretical value, possibly because the N and S signals are too small, owing to the small photoionization potentials of the two atoms, which leads to poor spectra quality and prevents reliable quantification of the percentage compositions of the two elements. No peaks corresponding to oxidized sulfur such as $RSO_3^-$ (XPS S(2p) BE~168 eV) are observed either before or after UV exposure. This result is believed to be due to a lack of photo-induced sulfur oxidation.

Figure 13A:
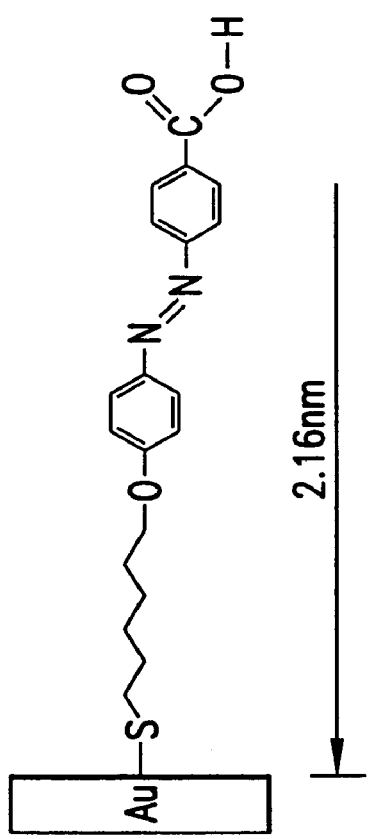
FIG. 13A shows the all trans molecular structure and thickness thereof for SAM-azo-COOH.
Figure 13B:
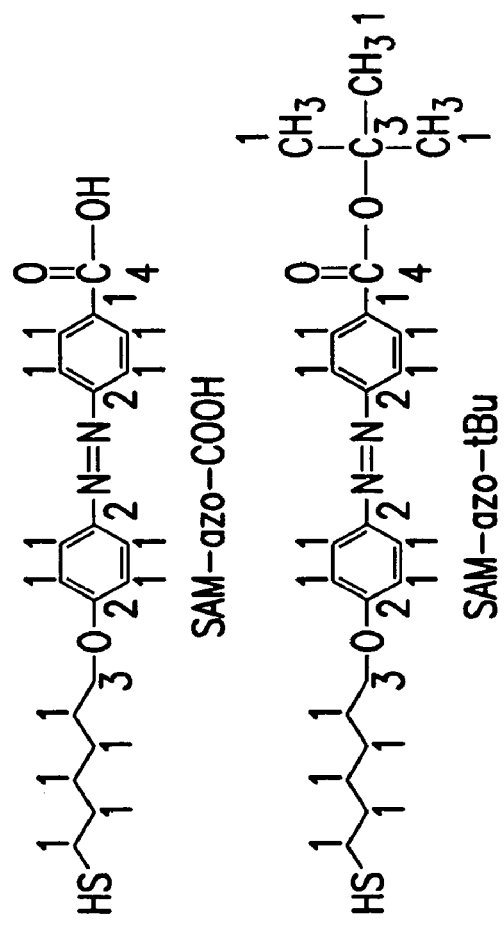
FIG. 13B shows the C1s peak assignments for SAM-azo-COOH and SAM-azo-tBu.

High resolution C-1s and O-1s spectra values are summarized in Table 4. For both SAM-azo-COOH and SAM-azo-tBu, the O-1s high resolution spectra show 3 peaks (BE=532.7 eV, 532.1 eV and 531.7 eV) with an area ratio of about 1:1:1. The O-1s peaks are ascribed to O(C=O*—O), the ether O adjacent to the benzene ring ($CH_2$—O*-$\theta^{34a,45}$) and the ester O(C=O—O*), respectively, from high BE to low BE. With regard the C-1s spectra, the theoretical $C*H_2$ percentage composition is calculated to be 73.7% for SAM-azo-COOH (14 C atoms out of 19 total C atoms) and 73.9% for SAM-azo-tBu (17 C atoms out of 23 total C atoms). The 73.7% value is very close to the experimentally measured value of 75.08% (Table 4). The BE 286.8 eV peak (BE shift=2.2 eV relative to the main aliphatic C-1s peak having BE=284.6 eV) is due to the aliphatic C adjacent to the ether O(HS—$(CH_2)_5$—C*—O-$\phi$), while the BE shift for the C in the benzene ring next to the ether C is about 1.1 eV (BE=285.7 eV). The C1s peak assignments, as shown in FIG. 13B, are as follows: C4(288.7 eV), C3(286.8 eV), C2(285.7 eV) and C1(284.6 eV), where C1, C2, C3 and C4 are as shown in FIG. 13B, with an area ratio 1:1:3:14 for SAM-azo-COOH and an area ratio 1:2:3:17 for SAM-azo-tBu.

To evaluate the thickness of the SAMs, the photoelectron intensity ratio of the SAM peaks (C-1s) to the substrate peaks (Au-4-$f_{7/2}$) was monitored by AMPS as a function of take-off angle. For a flat and uniform overlayer, or SAM, the uniform overlayer model predicts the following relation for the intensities under the assumption that the mean free paths of photoelectron from both substrate and SAM are equal:

$$I(SAM)/I(substrate)=K*(e^{d/(\lambda*\sin\theta)}-1),$$

where K is an instrument constant, d is the SAM thickness, and $\lambda$ is the photoelectron mean free path or attenuation length defined as the distance normal to the surface at which the probability of an electron escaping without significant energy loss due to inelastic scattering processes is 1/e of the original value of the probability of formation. $\lambda$ is a function of kinetic energy and material electron density.

Figure 14:
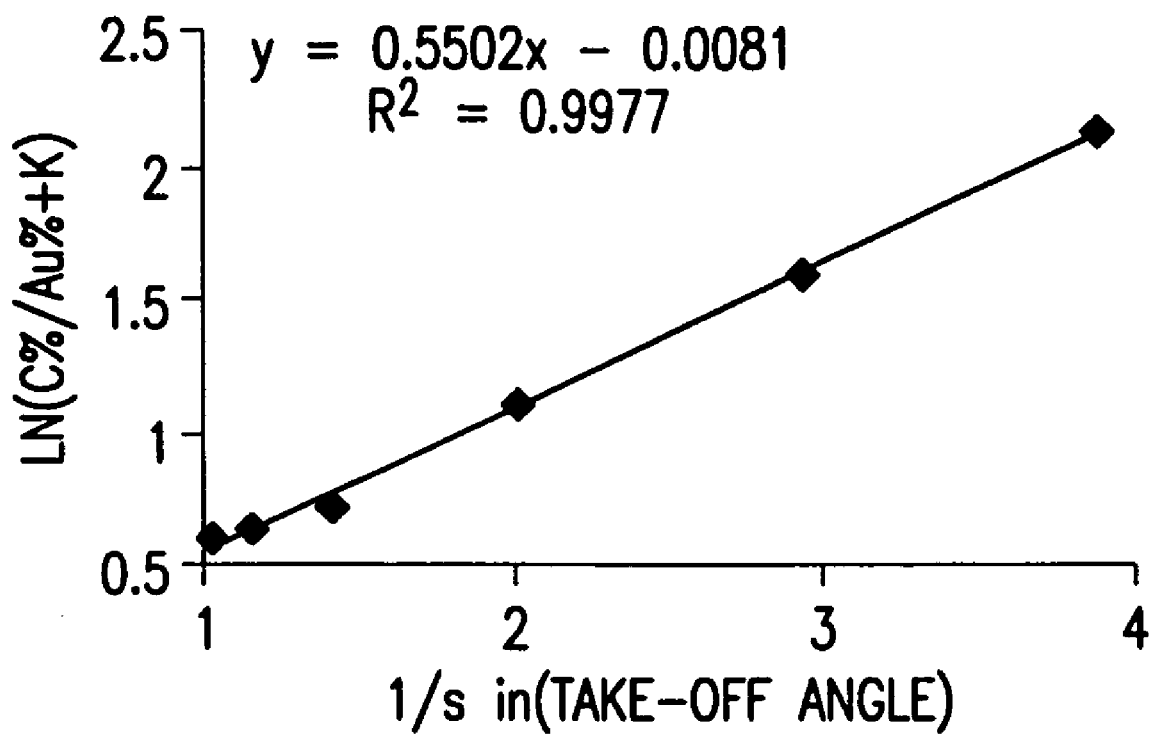
FIG. 14 shows a plot of $\ln(I(C\_SAM)/I(Au\_substrate)+K')$ vs. $1/\sin \theta$.

A plot of $\ln(I(C\_SAM)/I(Au\_substrate)+K')$ vs. $1/\sin\theta$ has a slope $d/\lambda$, from which the SAM thickness d can be obtained. K' here is determined by the photoelectron intensity ratio of the SAM peaks (C-1s) to the substrate peaks (Au-$4f_{7/2}$) for a SAM of known thickness. The SAM of dodecanthiol (HS—$C_{12}H_{23}$), which has a nominal thickness of 1.7 nm, was used. FIG. 14 shows a plot of $\ln(I(C\_SAM)/I(Au\_substrate)+K')$ vs. $1/\sin\theta$. A value of $\lambda=3.88$ nm was calculated from the average of the values of $\lambda(Au)=4.2$ nm and $\lambda(C)=3.55$ nm disclosed in, for example, C. D. Bain and G. M. Whitesides, J. Phys. Chem., Vol. 93 (1989), p. 1670. The XPS measured thickness d for SAM-azo-COOH and for SAM-azo-tBu is tabulated in Table 3. Both d values are close to the value of 2.16±0.30 nm predicted theoretically by modeling the all trans-molecular structure shown in FIG. 13A, indicating that the azobenzene SAMs possess a molecular orientation essentially perpendicular to the plane of the surface or having a small tilting angle.

TABLE 3

XPS elemental composition at 45° take-off angle, sessile drop water contact angle, and ADXPS estimated thickness of SAM-azo-COOH and SAM-azo-tBu.

| | | C %[2] | O % | S % | N % | $\theta s(°c)$[3] | d (nm) (experimental) |
|---|---|---|---|---|---|---|---|
| SAM-azo-tBu | Theory[1] | 79.31 | 10.34 | 3.44 | 6.9 | 99 | 2.13 |
| | Experiment | 79.34 | 15.66 | 1.41 | 3.59 | | |
| SAM-azo-COOH | Theory | 76 | 12 | 4 | 8 | 32 | 2.10 |
| | Experiment | 82.83 | 12.59 | 2.12 | 2.17 | | |

[1]Calculated from the molecular structure.
[2]The uncertainty of the C and O values is 5%; the uncertainty of S and N values is 15%.
[3]The uncertainty of contact angle values obtained from multiple measurements is ±2°.

TABLE 4

XPS values of C-1s and O-1s deconvolution at 45° take-off angle of SAM-azo-COOH and SAM-azo-tBu.

| | Atom type | Peak Position (eV) | Chemical shifts | FWHM (eV) | C % (theory) | C % (experiment) |
|---|---|---|---|---|---|---|
| SAM-azo-COOH | $C*H_2$ | 284.6 | 0 | 1.16 | 73.68 | 75.08 |
| | O=C*—O | 288.6 | 4.0 | 1.33 | 5.26 | 3.82 |
| | $C*H_2$—O | 286.5 | 1.9 | 1.55 | 5.26 | 8.91 |
| | Other C* | 285.4 | 0.8 | 1.40 | 15.79 | 12.2 |
| | C=O*—OH | 533.0 | 1.6 | 1.53 | 33.33 | 33.64 |
| | $CH_2$—O*-$\phi$ | 532.7 | 1.3 | 1.38 | 33.33 | 31.60 |
| | C=O—O*H | 531.4 | 0 | 1.41 | 33.33 | 34.76 |
| SAM-azo-tBu | $C*H_2$ | 284.6 | 0 | 0.98 | 73.91 | 74.66 |
| | O=C*—O | 288.6 | 4.0 | 0.85 | 4.35 | 3.81 |
| | $C*H_2$—O | 285.4 | 0.8 | 0.81 | 8.70 | 8.13 |
| | Other C* | 286.6 | 1.8 | 1.48 | 13.04 | 13.4 |
| | $CH_2$—O*-$\phi$ | 533.0 | 1.6 | 1.24 | 33.33 | 33.33 |
| | C=O*—OH | 532.7 | 1.3 | 1.18 | 33.33 | 33.28 |
| | C=O—O*H | 531.4 | 0 | 1.23 | 33.33 | 33.39 |

12) Water Condensation Imaging of Patterned Azobenzene SAMs.

Figure 15A:
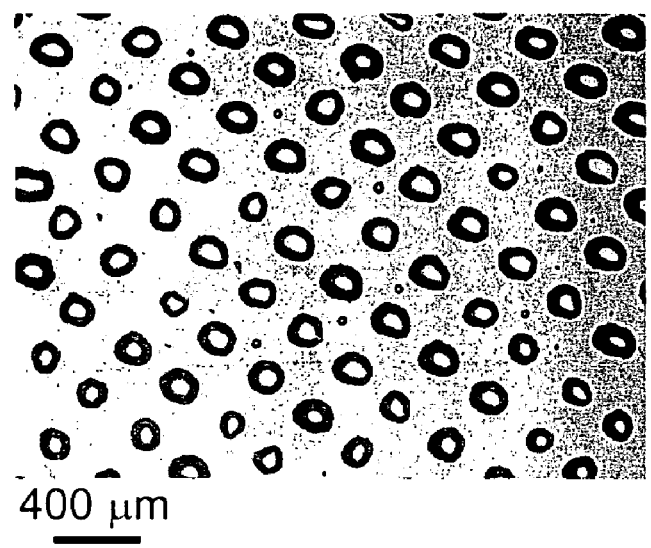
FIG. 15A shows an optical micrograph of water condensation images on a surface patterned with SAM-azo-tBu and SAM-azo-COOH with 550 µm spacing using a 5× objective.
Figure 15B:
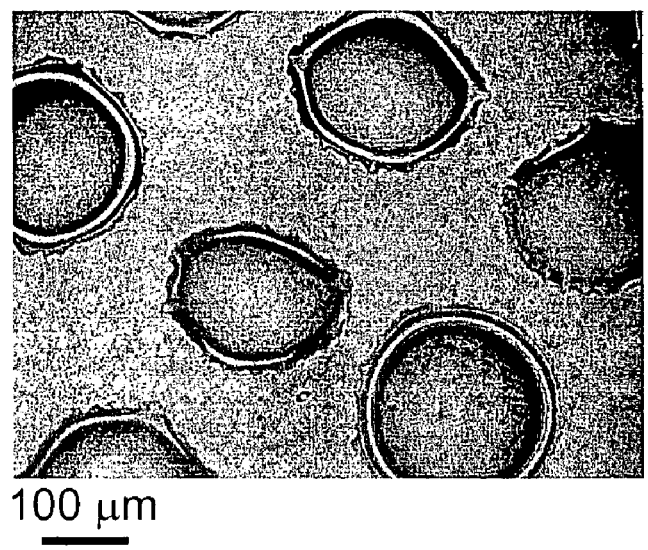
FIG. 15B shows an optical micrograph of water condensation images on a surface patterned with SAM-azo-tBu and SAM-azo-COOH with 550 µm spacing using a 20× objective.

The patterned azobenzene SAMs were also investigated using water condensation imaging. Water vapor from breath or from heated water was allowed to condense on the cold surface selectively at hydrophilic surface regions to form an ordered array of droplets. The water condensation images are not indefinitely stable, owing to water vaporization. Accordingly, the water condensation images were taken immediately upon condensation of the water vapor. FIG. 15 shows optical micrographs of water condensation images on patterned SAM-azo-tBu/SAM-azo-COOH surfaces with 550 μm spacing using 5× (FIG. 15A) and 20× (FIG. 15B) objectives. The water condensation images are believed to correspond to the hydrophilic —COOH groups which are formed by the photopatterned deprotection of the t-butyl groups of SAM-azo-tBu.

It should be understood that various changes and modifications to the exemplary embodiments described herein will be apparent to those skilled in the art. Such changes and modifications can be made without departing from the spirit and scope of this invention, the scope being defined by the appended claims.

We claim:

1. A method for modifying a surface of a self-assembled monolayer, comprising:
   a) forming on a substrate a self-assembled monolayer of organic groups, wherein each organic group has the general formula W-Sp-ff, wherein W is a heteroatom or a group containing at least one heteroatom, Sp is a spacer comprising an alkylene chain in which one or more carbon atoms may be replaced with a heteroatom, a group containing one or more heteroatoms, an arylene group, or a combination thereof, and ff is a non-acidic first functionality capable of being converted to a second functionality by exposure to an acid;
   b) forming a coating on the self-assembled monolayer, wherein the coating comprises a photoacid generator; and
   c) selectively photoirradiating the coating to generate an acid in each irradiated region of the coating, wherein the acid converts the first functionality of the self assembled monolayer underlying the respective irradiated region of the coating to the second functionality.

2. The method of claim 1, wherein the substrate is comprised of a metal, plastic, glass, insulators, semiconductors, or conductors.

3. The method of claim 1, wherein the substrate is gold or glass.

4. The method of claim 1, wherein W is selected from the group consisting of S, O, NH or NR, wherein R is an optionally substituted alkyl group or an optionally substituted aryl group.

5. The method of claim 1, wherein Sp-ff is Alk-Z—Ar$_1$—(Y=Y)$_n$—Ar$_2$—COOR$_1$, wherein -Alk- is a C$_m$ alkylene chain, wherein m is between 5 and 20; —Z— is O, S, or —NR$^2$—, wherein R$^2$ is one of hydrogen, C$_{1-20}$ alkyl, and phenyl; each of —Ar$_1$— and —Ar$_2$— is 1,4-phenylene; Y is one of an atom and a group capable of forming one of an (E)- and (Z)-double bond with another one of a Y atom and a Y group; n is between 1 and 20; and R$_1$ is one of hydrogen, C$_{1-20}$ alkyl, and phenyl.

6. The method of claim 1, wherein ff is selected from the group consisting of esters of carboxylic acids, anhydrides of carboxylic acids, primary, secondary and tertiary amides of carboxylic acids, nitriles, esters of sulfonic acids, anhydrides of sulfonic acids, primary, secondary and tertiary amides of sulfonic acids, esters of thiocarboxylic acids, and esters of sulfinic acids.

7. The method of claim 1, wherein ff is selected from the group consisting of ether functionalities and amino functionalities.

8. The method of claim 1, wherein W-Sp-ff is selected from the group consisting of an (E) or (Z) isomer of S—(CH$_2$)$_6$—O—C$_6$H$_4$—N=N—C$_6$H$_4$—CO$_2$H, and an (E) or (Z) isomer of S—(CH$_2$)$_6$—O—C$_6$H$_4$—N=N—C$_6$H$_4$—CO$_2$C(CH$_3$)$_3$.

9. The method of claim 1, wherein the photoacid generator is a photoacid generator of structure I or a photoacid generator of structure II:

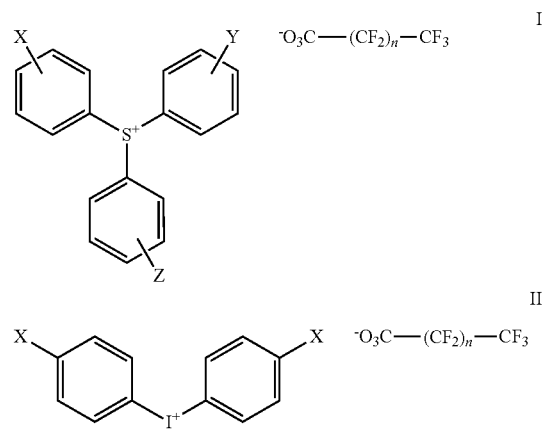

wherein X is selected from the group consisting of H, O(CH$_2$)$_7$ Me, t-Butyl, O—CH$_3$, CF$_3$, and thienyl;
Y is selected from the group consisting of H, t-Butyl, O—CH$_3$, 1-naphthyl, 2-naphthyl, and thienyl;
Z is selected from the group consisting of H, t-Butyl, O—CH$_3$, 1-naphthyl, and 2-naphthyl; and
n=0-10.

10. The method of claim 1, wherein each organic group is formed by reacting the substrate with a compound capable of forming a covalent bond at the surface of the substrate.

11. The method of claim 10, wherein the compound has the structure H—W-Sp-ff, wherein H is hydrogen, W is a heteroatom or a group containing at least one heteroatom, Sp is a spacer comprising a C$_5$-C$_{50}$ alkylene chain in which one or more carbon atoms may be replaced with a heteroatom, a group containing one or more heteroatoms, an arylene group, or a combination thereof, and ff is a first functionality capable of being converted to a second functionality by exposure to an acid.

12. The method of claim 1, wherein the coating on the self-assembled monolayer further comprises a polymer.

13. The method of claim 1, wherein the coating is selectively photoirradiation in one or more regions thereof with radiation having a spatially varying intensity pattern.

14. The method of claim 13, wherein selective photoirradiation comprises using a patterned proximity mask.

15. The method of claim 13, wherein selective photoirradiation comprises using a patterned contact mask.

16. The method of claim 13, wherein selective photoirradiation comprises using a patterned mask and a beam of radiation.

17. The method of claim 13, wherein selective photoirradiation comprises using a scanning beam of radiation.

18. The method of claim 1, wherein the second functionality is an acidic functionality.

19. The method of claim 18, further comprising step d) converting the acidic functionality to an acid derivative functionality.

20. The method of claim 19, further comprising step e) formation of a covalent bond, a non-covalent bond or a hydrophobic interaction between the acid derivative functionality and a biomolecule or a biomolecular moiety.

21. The method of claim 20, wherein the biomolecule or biomolecular moiety is selected from the group consisting of streptavidin, Alexa488 tagged Streptavidin, bovine serum albumin, and fluorescein-5 isothiocyanate tagged bovine serum albumin.

22. The method of claim 1, further comprising removing the coating.

23. The method of claim 22, wherein removing the coating comprises treating the coating with an organic polar or nonpolar solvent in which the coating is soluble.

24. The method of claim 23, wherein the solvent is toluene.

25. The method of claim 1, wherein

W is selected from the group consisting of S, O, NH, or NR, wherein R is an optionally substituted alkyl group or an optionally substituted aryl group;

Sp is a $C_5$-$C_{50}$ alkylene chain in which one or more carbon atoms may be replaced with a heteroatom, an arylene group or a combination thereof; and ff is selected from the group consisting esters of carboxylic acids, anhydrides of carboxylic acids, primary, secondary and tertiary amides of carboxylic acids, nitriles, esters of sulfonic acids, anhydrides of sulfonic acids, primary, secondary and tertiary amides of sulfonic acids, esters of thiocarboxylic acids, esters of sulfinic acids, ethers and amines.

26. A method for modifying a surface of a self-assembled monolayer, comprising:

a) forming on a substrate a self-assembled monolayer of organic groups, wherein each organic group has the general formula W-Sp-ff, wherein W-Sp-ff is selected from the group consisting of an (E) or (Z) isomer of S—$(CH_2)_6$—O—$C_6H_4$—N=N—$C_6H_4$—$CO_2$C($CH_3$)$_3$;

b) forming a coating on the self-assembled monolayer, wherein the coating comprises a photoacid generator of structure I or a photoacid generator of structure II:

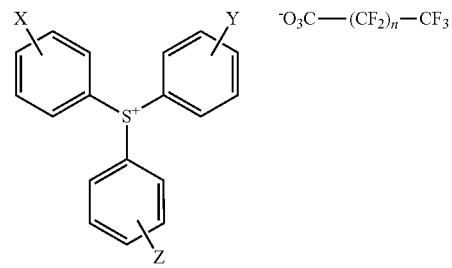

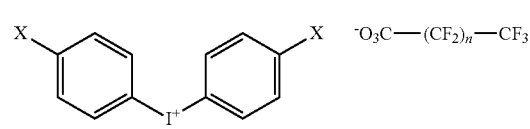

wherein X is selected from the group consisting of H, O($CH_2$)$_7$ Me, t-Butyl, O—$CH_3$, $CF_3$, and thienyl;

Y is selected from the group consisting of H, t-Butyl, O—$CH_3$, 1-naphthyl, 2-naphthyl, and thienyl;

Z is selected from the group consisting of H, t-Butyl, O—$CH_3$, 1-naphthyl, and 2-naphthyl; and n=0-10; and c) selectively photoirradiating the coating to generate an acid in each irradiated region of the coating, wherein the acid converts the self assembled monolayer underlying the respective irradiated region of the coating to an (E) or (Z) isomer of S—$(CH_2)_6$—O—$C_6H_4$—N=N—$C_6H_4$—$CO_2$H.

27. The method of claim 12, wherein the coating is formed on the self-assembled monolayer by adsorbing, spin coating, roll coating or slot coating the polymer on the self-assembled monolayer.

28. The method of claim 1, wherein the photoirradiation is performed via ultraviolet radiation.

* * * * *

UNITED STATES PATENT AND TRADEMARK OFFICE
CERTIFICATE OF CORRECTION

PATENT NO.          : 8,173,347 B2                                            Page 1 of 1
APPLICATION NO.     : 11/201915
DATED               : May 8, 2012
INVENTOR(S)         : Jeffrey T. Koberstein et al.

It is certified that error appears in the above-identified patent and that said Letters Patent is hereby corrected as shown below:

Title page 3, Column 1, Replace "Hem, Diane L. and Jeffrey A. Hubbell. "Incorporation of adhesion peptides into nonadhesive hydrogels useful for tissue resurfacing." J. Biomed. Mater. Res, 39:266-276. (1998)." with -- Hern, Diane L. and Jeffrey A. Hubbell. "Incorporation of adhesion peptides into nonadhesive hydrogels useful for tissue resurfacing." J. Biomed. Mater. Res, 39:266-276. (1998). --.

In the Claims:

At column 22, claim number 9, line number 11, please replace "$O_3C\text{-}(CF_2)_n\text{-}CF_3$" with "$^-O_3S\text{-}(CF_2)_n\text{-}CF_3$".

At column 22, claim number 9, line number 22, please replace "$O_3C\text{-}(CF_2)_n\text{-}CF_3$" with "$^-O_3S\text{-}(CF_2)_n\text{-}CF_3$".

At column 22, claim number 13, line number 50, please replace "photoirradiation" with "photoirradiating".

At column 24, claim number 26, line number 3, please replace "$O_3C\text{-}(CF_2)_n\text{-}CF_3$" with "$^-O_3S\text{-}(CF_2)_n\text{-}CF_3$".

At column 24, claim number 26, line number 14, please replace "$^-O_3C\text{-}(CF2)_n\text{-}CF_3$" with "$^-O_3S\text{-}(CF_2)_n\text{-}CF_3$".

Signed and Sealed this
Twenty-sixth Day of June, 2012

David J. Kappos
*Director of the United States Patent and Trademark Office*

UNITED STATES PATENT AND TRADEMARK OFFICE
CERTIFICATE OF CORRECTION

PATENT NO. : 8,173,347 B2  
APPLICATION NO. : 11/201915  
DATED : May 8, 2012  
INVENTOR(S) : Jeffrey T. Koberstein et al.

Page 1 of 1

It is certified that error appears in the above-identified patent and that said Letters Patent is hereby corrected as shown below:

On page 1, Column 1, line 8, please insert the following paragraph:

--This invention was made with government support under grant DAAD 10-00-1-0104 awarded by the Army Research Office. The government has certain rights in the invention.--

Signed and Sealed this
Second Day of October, 2012

David J. Kappos
*Director of the United States Patent and Trademark Office*

UNITED STATES PATENT AND TRADEMARK OFFICE
CERTIFICATE OF CORRECTION

| | | |
|---|---|---|
| PATENT NO. | : 8,173,347 B2 | Page 1 of 1 |
| APPLICATION NO. | : 11/201915 | |
| DATED | : May 8, 2012 | |
| INVENTOR(S) | : Jeffrey T. Koberstein et al. | |

It is certified that error appears in the above-identified patent and that said Letters Patent is hereby corrected as shown below:

On page 1, Column 1, line 8, please insert the following paragraph:

--This invention was made with government support under grant DAAD 19-00-1-0104 awarded by the Army Research Office. The government has certain rights in the invention.--

This certificate supersedes the Certificate of Correction issued October 2, 2012.

Signed and Sealed this
First Day of January, 2013

David J. Kappos
*Director of the United States Patent and Trademark Office*